United States Patent [19]
Yang et al.

[11] Patent Number: 5,914,279
[45] Date of Patent: Jun. 22, 1999

[54] SILICON NITRIDE SIDEWALL AND TOP SURFACE LAYER SEPARATING CONDUCTORS

[75] Inventors: Ming Yang, Richardson; Takayuki Niuya, Plano, both of Tex.

[73] Assignee: Texas Instruments Incorporated, Dallas, Tex.

[21] Appl. No.: 08/845,755

[22] Filed: Apr. 25, 1997

Related U.S. Application Data

[60] Provisional application No. 60/017,065, Apr. 26, 1996.

[51] Int. Cl.$^6$ .................................................. H01L 21/00
[52] U.S. Cl. .......................... 438/724; 438/692; 438/696; 438/733; 438/744; 252/79.1; 257/752; 257/758
[58] Field of Search .................................... 438/692, 696, 438/697, 723, 724, 733, 744; 216/38, 67; 252/79.1; 257/734, 752, 758

[56] References Cited

U.S. PATENT DOCUMENTS 5,691,219  11/1997  Kawakubo et al. ..................... 438/692

*Primary Examiner*—William Powell
*Attorney, Agent, or Firm*—Robby T. Holland; Carlton H. Hoel; Richard L. Donaldson

[57] ABSTRACT

An integrated circuit includes a conductive structure (66) is formed with a top layer of silicon nitride (62) and silicon nitride (70) sidewalls on a semiconductor substrate. The layer of silicon nitride (70) covering the sidewalls of the conductive structure (66) intersect with the layer of silicon nitride on top of the conductive structure with a relatively square shoulder. A subsequently deposited conductor makes contact with the surface of the semiconductor substrate (56) without shorting to the conductive structure (66) on the semiconductor substrate.

15 Claims, 28 Drawing Sheets

5,914,279

SILICON NITRIDE SIDEWALL AND TOP SURFACE LAYER SEPARATING CONDUCTORS

RELATED PATENT APPLICATION

This application claims priority under 35 USC 119(e) (1) of provisional application Ser. No. 60017,065 filed Apr. 26, 1996.

This application is related to a patent application, Ser. No. 60/017,358 filed Apr. 26, 1996 not converted to a nonprovisional application.

FIELD OF THE INVENTION

This invention relates to an integrated circuit semiconductor devices and more particularly to a semiconductor device structure.

BACKGROUND OF THE INVENTION

In a fabrication process for forming a 64 Mbit DRAM device, a sidewall nitride etching step produces a round shoulder in a silicon nitride, $Si_3N_4$, dielectric material layer covering a conductive stripe, such as a wordline. The dielectric material is placed there to provide sufficient electrical insulation to maintain separation between the wordline and other conductive material, such as in a bitline contact or a storage node contact. Because of the round shoulder in the silicon nitride, the shortest distance from a corner of the wordline to the bitline contact or the storage node contact is at a minimum to maintain the desired electrical separation of the two conductors.

However, the fabrication process proceeds with, for example, a storage node contact etch step. Because of the shape of the round shoulder in the silicon nitride, oxidenitride selectively is reduced at that shoulder during the storage node contact etch. Consequently, the thickness of the silicon nitride is reduced below the desired minimum and an undesirable short circuit may occur between the wordline and the bitline contact or the storage node contact.

Current literature describes several chemistries for etching silicon nitride. Characteristics and properties of etching silicon nitride with either carbon fluoride, $CF_4$, sulfur fluoride, $SF_6$, or nitrous fluoride in an inert mixture are described. Information presented includes the etch rate and selectivity. No information describes the effect of etching on the profile of the sidewall silicon nitride. That profile, however, is very important for developing a useful silicon nitride insulating structure between two conductors where at least one of the conductors has a sidewall and top surface covered with the silicon nitride.

SUMMARY OF THE INVENTION

This problem is resolved by a new integrated circuit including a first conductive structure formed with a top layer and a sidewall layer of silicon nitride on a semiconductor substrate. The layer of silicon nitride has relatively square shoulders where the silicon nitride covering the sidewalls of the conductive structure intersect with the silicon nitride covering the top surface of the conductive structure. A second conductive structure is deposited against the layer of silicon nitride.

BRIEF DESCRIPTION OF THE DRAWINGS

A better understanding of the invention may be achieved by reading the subsequent detailed description with reference to the drawings wherein:

FIG. 1AA is a cross-section of the part of FIG. 1Z after removal of the photoresist mask;

FIG. 1AB is a cross-section of the part of FIG. 1AA following a dry etch through layers of silicon oxides to open holes to the top surfaces of the storage node contact plugs;

FIG. 1AC is a cross-section of the part of FIG. 1AB after a conductive layer of polysilicon is deposited overall;

FIG. 1AD is a cross-section of the part of FIG. 1AC following the deposit of a layer of silicon oxides from TEOS;

FIG. 1AE is a cross-section of the part of FIG. 1AD after a photoresist is deposited and formed into a mask;

FIG. 1AF is a cross-section of the part of FIG. 1AE following the etching of the silicon oxide away except for mesas under the photoresist mask;

FIG. 1AG is a cross-section of the part of FIG. 1AF following removal of the photoresist mask, FIG. 1AH is a cross-section of the part of FIG. 1AG after a layer of metal is deposited overall;

FIG. 1AI is a cross-section of the part of FIG. 1AH following an etch of the layer of metal leaving metal sidewalls on the remaining oxide mesas;

FIG. 1AJ is a cross-section of the part of FIG. 1AI after the oxide mesas and other exposed oxides are etched away;

FIG. 1AK is a cross-section of the part of FIG. 1AJ following deposits of a layer of silicon oxide and a layer of silicon nitride overall;

FIG. 1AL is a cross-section of the part of FIG. 1AK after a layer of a conductor, such as polysilicon or a metal, is deposited overall;

FIG. 2O shows the cross-section of the part of FIG. 2N following an oxide etch and removal of the photoresist mask;

DETAILED DESCRIPTION

Figure 1A:
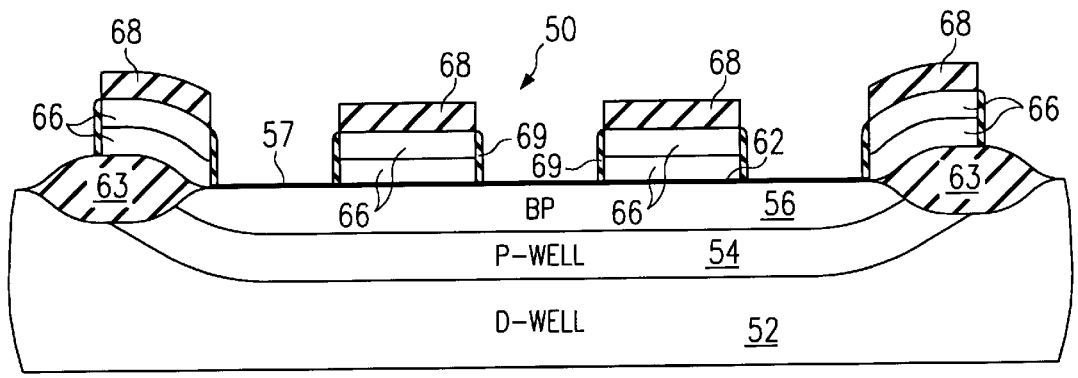
FIG. 1A is a cross-section of a part of an array of memory cells and peripheral circuits which have conductive structures built upon a semiconductor substrate.

Referring now to FIG. 1A, there is shown a cross-section of a partially fabricated semiconductor integrated circuit device 50. An n-type deep well 52 is implanted into a semiconductor substrate under a memory array arrangement to be fabricated. A p-type well 54 is also implanted into the substrate under the memory array. Additionally there is a boron phosphorous region 56 formed between the p-type well 54 and a top surface 57 of the semiconductor substrate. Other doped regions can be implanted into the substrate for forming desired electrical circuit devices.

The upper surface 57 of the semi-conductor substrate 52 may include implanted regions which are to be used as contacts for other interconnecting elements of the integrated circuit. Deposited on the surface of the substrate is a thin layer of insulating material 62, such as silicon dioxide or silicon nitride. Thicker regions 63 of insulating material, such as silicon dioxide, are formed, as regions referred to as LOCOS.

Upon the thin layer 62 and the thick regions 63, more elements of the integrated circuit are fabricated. There are several stacks of conductors 66, which are used for transistor gate structures and other conduction paths, or conducting stripes. A layer of insulating silicon nitride 68 is laid over the top of each stack of conductors. A thin layer of insulating silicon dioxide 69 is laid over the sidewalls of the stacks of conductors 66, or conducting stripes.

Figure 1B:
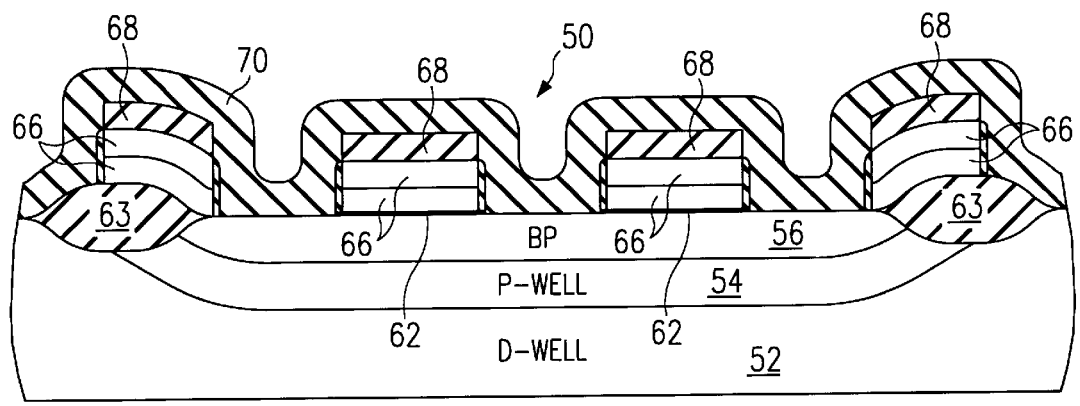
FIG. 1B is a cross-section of the part of FIG. 1A after a layer of silicon nitride is deposited overall.

As shown in FIG. 1B, a layer of insulating material, silicon nitride, 70 is deposited over all of the device 50.

Figure 1C:
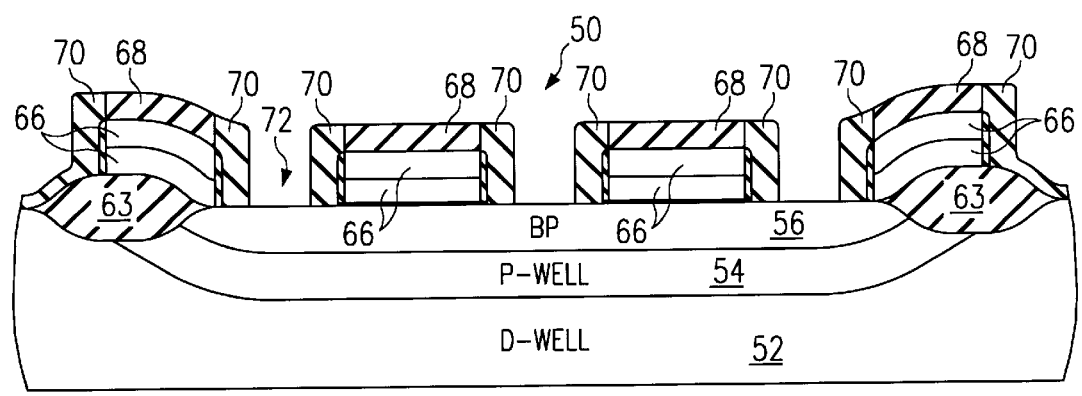
FIG. 1C is a cross-section of the part of FIG. 1B after a dry etch of the silicon nitride leaving relatively square shoulders in the silicon nitride covering the sidewalls of the conductive structures.

In FIG. 1C, there is shown a cross-section resulting after the silicon nitride layer 70 is etched back overall for making a channel 72 where a bitline contact hole or a storage node contact hole eventually will connect another conductor with the surface of the semiconductor substrate. This channel 72 is etched through the layer of silicon nitride at a location between two stacks of conductors 66.

A new etching technique is used for this part of the process sequence. This etch is a dry etch of silicon nitride and is performed in two separate steps in a LAM Model 4400 etcher.

This two-step, silicon nitride, etch process achieves a desirable square shoulder or vertical sidewall profile of the silicon nitride around the conducting stripes.

In the first step, chlorine, $Cl_2$, sulfur fluoride, $SF_6$, Freon23, $CHF_3$, and helium, He, are used to give an anisotropic etch to achieve a square shoulder or vertical sidewall silicon nitride profile. This sidewall silicon nitride etch step employs aspects of both physical and chemical etching. The etching mechanism employed involves a combination of ion bombardment and polymerization from the Freon 23, $CHF_3$ and chlorine, $Cl_2$. The combination of these two mechanisms can perform an anisotropic etch of the silicon nitride. The silicon nitride is preferentially removed in the vertical direction leaving a square shouldered profile in the silicon nitride.

For the first step in etching through the silicon nitride, the conditions are:

| Pressure | 255 | +/−20% | m torr |
|---|---|---|---|
| Gap | 1.3 | +/−10% | cm |
| Power | 205 | +/−20% | watts |
| $Cl_2$ | 25 | +/−20% | sccm |
| $SF_6$ | 155 | +/−20% | sccm |
| $H_e$ | 64 | +/−20% | sccm |
| $CHF_3$ | 11 | +/−20% | sccm |
| Time | Endpoint | +/−30% | secs |

A bottom electrode is held at approximately 20° C. As a result of this first step, a substantial part of the last layer of silicon nitride is removed from the tops of the stacks of conductors and down into the channels 72 to the top surface of the moat area 56. It is an anisotropic etch so the sidewall silicon nitride is etched into a vertically oriented surface. Polymers build up on the top surface of the silicon nitride retarding removal of silicon nitride at the shoulders and leaving relatively square shoulders. Some silicon nitride residue may remain in the bottoms of the moat areas.

As an alternative etching mixture just described, argon, Ar, may be substituted for the helium, He. Argon would be substituted for helium at a quantity of 80±20% sccm. Otherwise the etching conditions are as previously stated.

A Freon23, $CHF_3$, and helium, He, mixture is used for the second etch step in order to maintain the square shoulder or vertical profile of the sidewall silicon nitride resulting from the first step while clearing out the residue silicon nitride due to topography. This step occurs with a minimum of physical action to avoid pitting in the moat area.

For the second step of etching through the silicon nitride, the conditions are:

| Pressure | 200 | +/−20% | m torr |
|---|---|---|---|
| Gap | 1.5 | +/−10% | cm |
| Power | 130 | +/−20% | watts |
| $Cl_2$ | 0 | +/−20% | sccm |
| $SF_6$ | 0 | +/−20% | sccm |
| He | 130 | +/−20% | sccm |
| $CHF_3$ | 45 | +/−20% | sccm |
| Time | Endpoint | +/−30% | sec |

The bottom electrode is held at approximately 20° C. As a result of this second step, the contact channels 72 are etched down through any remaining silicon nitride to the surface 57 of the semiconductor substrate. Again, polymers form and protect the square shoulders of the sidewall silicon nitride. It is noted that helium, He, is an inert gas. Other inert gases, such as argon, Ar, or nitrogen, $N_2$, can be substituted for the helium. Argon would be substituted for helium at a quantity of 130±20% sccm. Otherwise the etching conditions remain as previously stated for the second step.

FIG. 1C shows the profile of the channels 72 in a cross-section of the device 50 after the sidewall silicon nitride etch steps, just described. The channels 72 provide space for connecting source/drain regions to a bitline or to storage nodes which are to be fabricated subsequently, as described hereinafter.

Figure 1D:
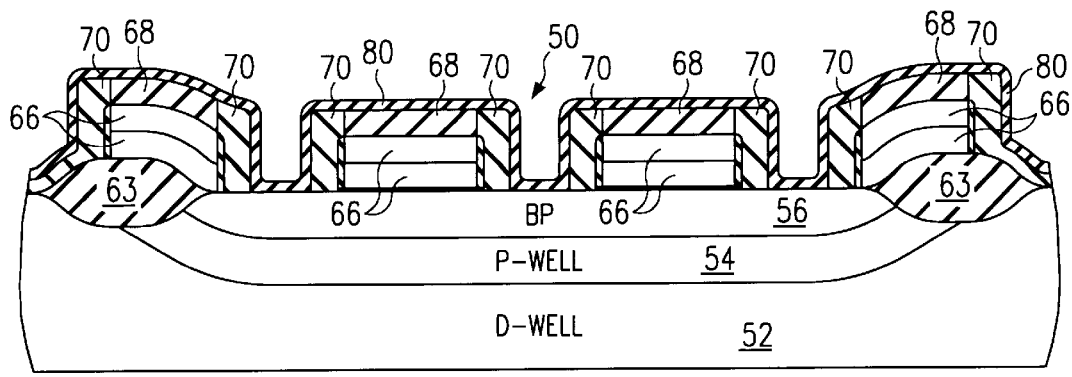
FIG. 1D is a cross-section of the part of FIG. 1C after a layer of silicon dioxide is deposited overall.

Referring now to FIG. 1D, there is shown that a layer of insulating material 80, such as silicon dioxide or silicon oxide, $SiO_x$, is deposited over the entire top surface of the integrated circuit device 50. This step of the process is accomplished by low pressure chemical vapor deposition from TEOS, or tetriethyloxisilane, $Si(OC_2H_5)_4$.

Figure 1E:
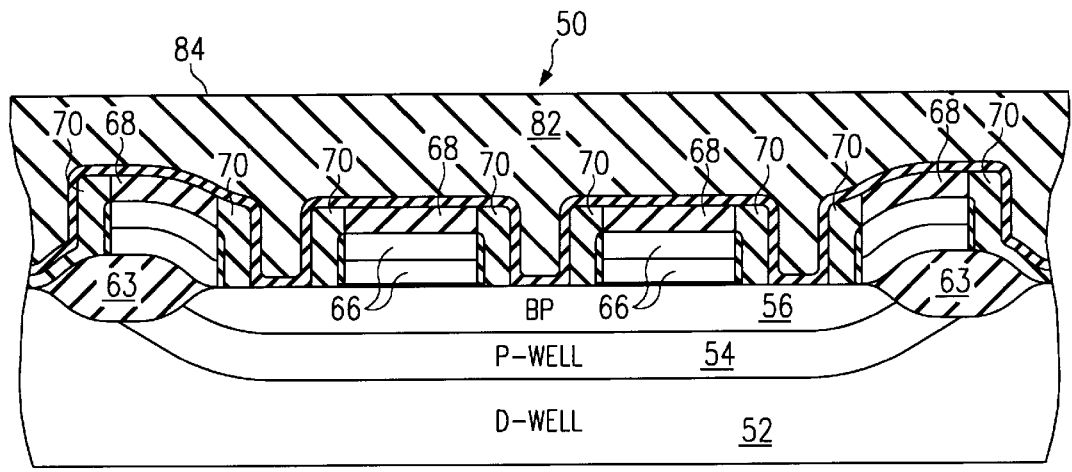
FIG. 1E is a cross-section of the part of FIG. 1D after a layer of boron phosphorous silicon glass is deposited overall.

As shown in FIG. 1E, after the TEOS is deposited, the entire device 50 is covered by boron phosphorous silicon glass, BPSG, 82 which forms a level top surface 84. This is an insulating material.

Figure 1F:
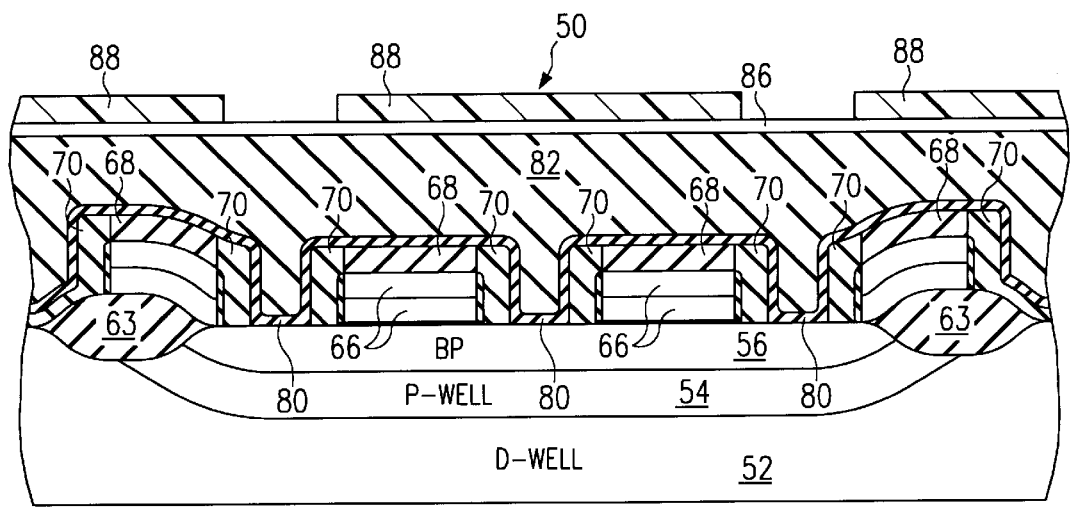
FIG. 1F is a cross-section of the part of FIG. 1E after a photoresist mask is formed on top of a layer of polysilicon deposited on the layer of boron phosphorous silicon glass.

In FIG. 1F, there is shown that a polysilicon hard mask material 86 is deposited on top of the BPSG 82. A photo resist 88 is deposited and patterned to open contact channels down through the hard mask 86, the BPSG material 82 and the silicon oxide, $SiO_x$, material 80 to the surface 57 of the substrate. The channels are positioned to provide storage node contacts or other desired conductors. These exemplary contact channels are to be made between stacks of conductors 66 forming gate electrodes or other conductive lines.

Figure 1G:
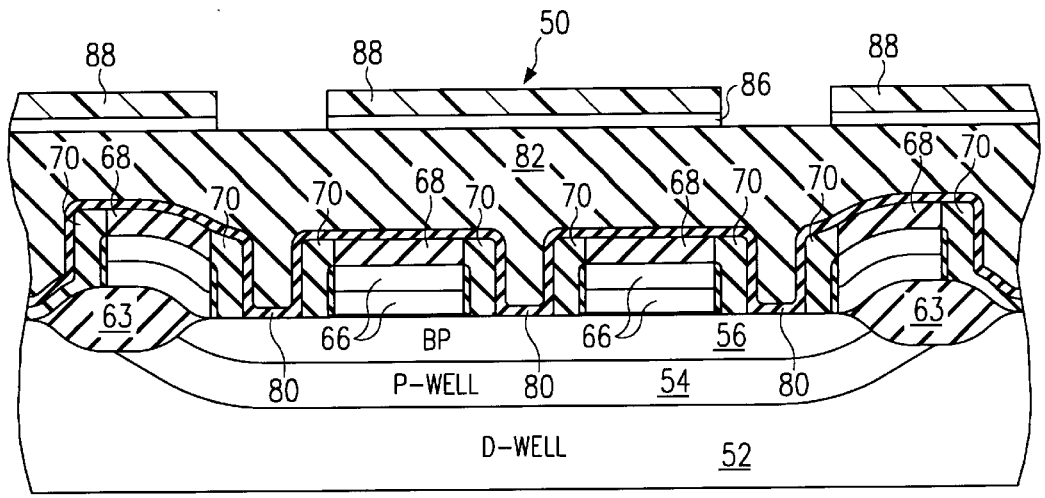
FIG. 1G is a cross-section of the part of FIG. 1F after the layer of polysilicon is etched to form a hard mask.

FIG. 1G shows the cross-section of the device 50 after the polysilicon hard mask material 86 is etched away in the areas left exposed by the photoresist material 88. This dry etch operation proceeds through the polysilicon hard mask and stops at the surface of the silicon oxide, $SiO_x$.

Figure 1H:
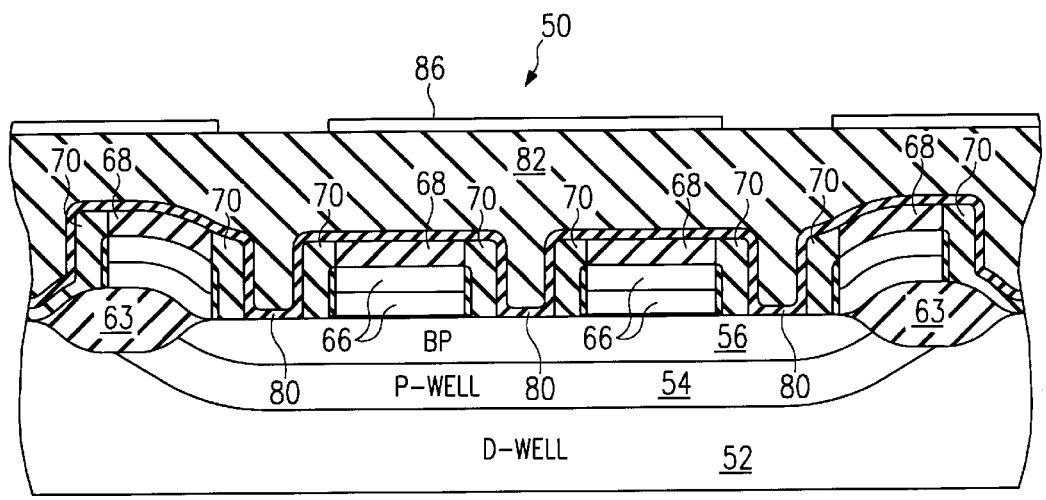
FIG. 1H is a cross-section of the part of FIG. 1G after the photoresist mask is removed.

As shown in FIG. 1H, the photoresist material is removed leaving the patterned hard mask material 86 on the top surface of the BPSG material 82. Openings through the hard mask are patterned to form channels, normal to the cross-section and back into the device 50.

Figure 1I:
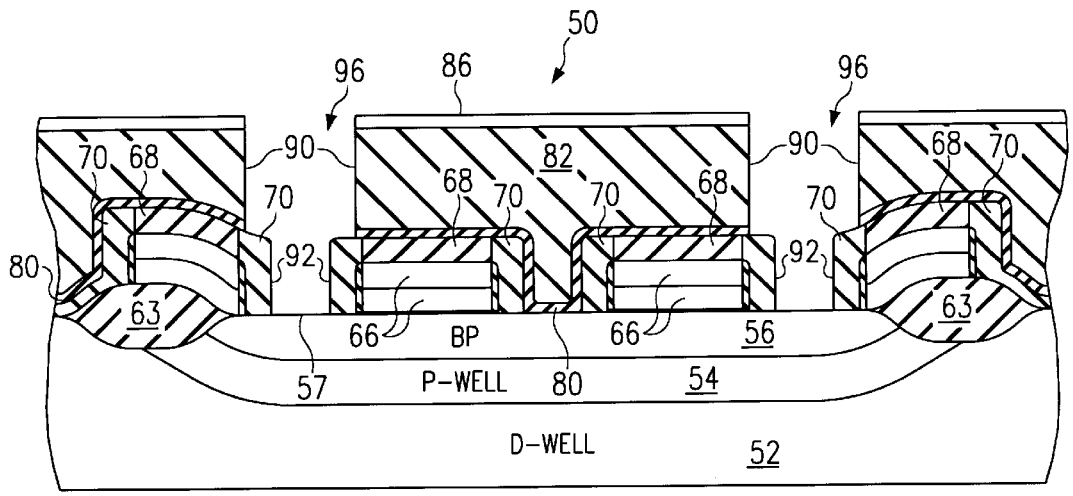
FIG. 1I is a cross-section of the part of FIG. 1H following a silicon oxide etch to make storage node contact plugs.

FIG. 1I shows the cross-section of the resulting integrated circuit structure 50 following an oxide etching through the BPSG and TEOS to the top surface 57 of the semiconductor substrate. This oxide etching is an anisotropic dry etching which removes BPSG leaving vertical walls 90 therein and removes the silicon oxide deposited from the TEOS leaving vertical walls 92 of the underlying silicon nitride. The silicon oxide deposited from the TEOS is etched selectively from the underlying silicon nitride 70 leaving relatively square shoulders in the sidewall silicon nitride 70. Consequently, the resulting thickness of the sidewall and top silicon nitride 70 and 68 covering the stacked conductive layers 66 provides the desired insulation to prevent shorting between the stacked layers of conductive material 66 from the contact plug to be fabricated in the channels 96. This oxide etching is accomplished in two etching steps.

For the first step of this oxide etch, the conditions are

| Pressure | 100 | +/−20% | m torr |
|---|---|---|---|
| Gap | 11 | +/−10% | mm |
| Power | 0 | +/−20% | watts |
| CO | 150 | +/−20% | sccm |
| Ar | 600 | +/−20% | sccm |
| $C_4F_8$ | 2 | +/−20% | sccm |
| $CF_4$ | 5 | +/−20% | sccm |
| Backside pressure | | | |
| (center) | 20 | | torr |
| (edge) | 7.5 | | torr |

The bottom electrode is held at approximately 20mC. As a result of this first step, a substantial part of the silicon oxide is removed for the storage node contact holes.

For the second step etching through the oxide, the conditions are:

| Pressure | 100 | +/−20% | m torr |
|---|---|---|---|
| Gap | 11 | +/−10% | mm |
| Power | 1500 | +/−20% | watts |
| CO | 150 | +/−20% | sccm |
| Ar | 600 | +/−20% | sccm |
| $C_4F_8$ | 2 | +/−20% | sccm |
| $CF_4$ | 5 | +/−20% | sccm |
| Backside pressure | | | |
| (center) | 20 | | torr |
| (edge) | 7.5 | | torr |

The bottom electrode is held at approximately 20mC. As a result of this second step, the storage node contact holes are etched down to the top surface of the semiconductor substrate. Any residue silicon oxide is removed. It is noted that argon is an inert gas and that helium or nitrogen can be substituted therefore.

Figure 1J:
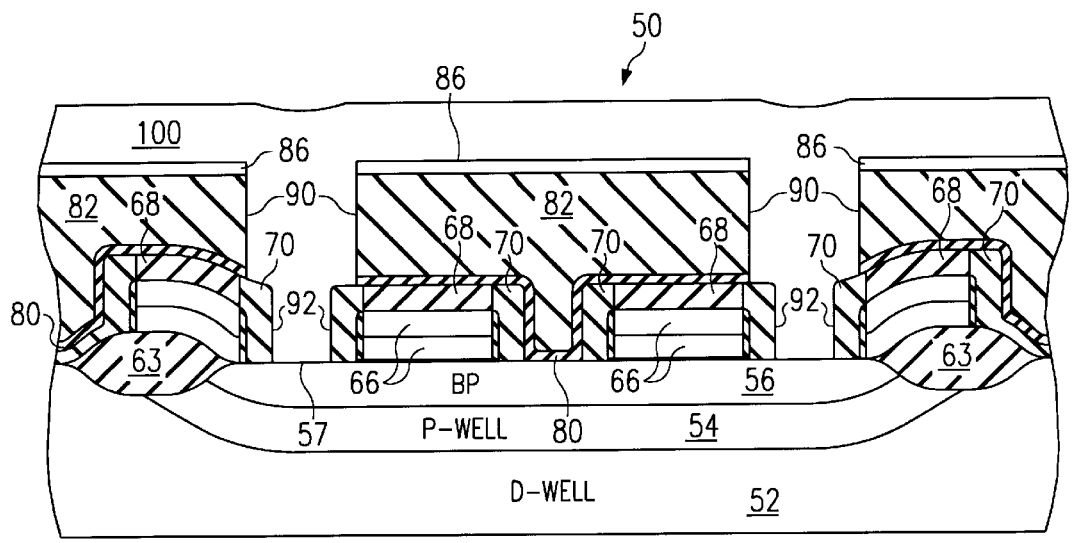
FIG. 1J is a cross-section of the part of FIG. 1I following a deposit of polysilicon making contact with the surface of the semiconductor substrate.

Thereafter, as shown in FIG. 1J, polysilicon 100 is deposited over the entire top of the semiconductor structure entirely filling the channels 96 to form the storage node contact plugs that are to be fabricated subsequently. The top surface of the polysilicon 100 finishes as a relatively flat surface.

Figure 1K:
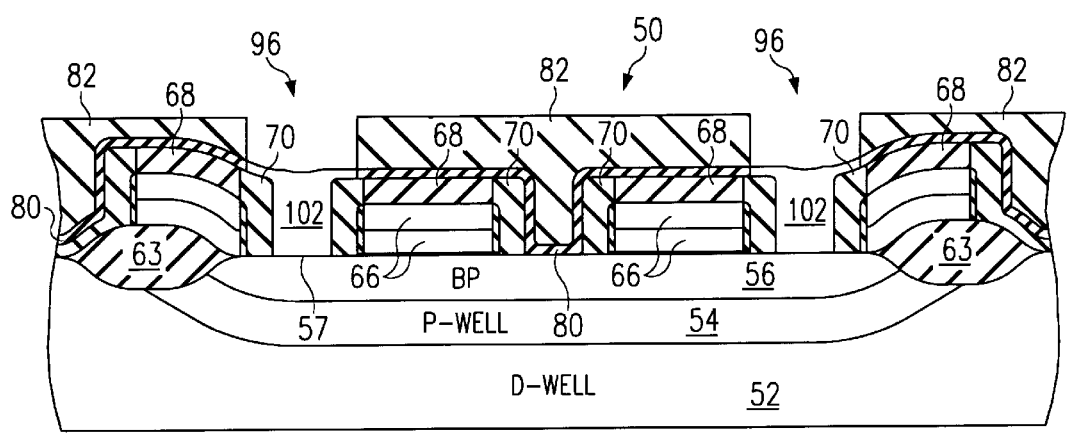
FIG. 1K is a cross-section of the part of FIG. 1J after the layer of polysilicon and the hard mask polysilicon are etched away.

Refer now to FIG. 1K. In this figure, there is shown the cross-section of the integrated circuit structure 50 after a polysilicon etch back. This etch removes part of the polysilicon layer 100 and the layer 86, shown in FIG. 1J. It is noted that in FIG. 1K some of the polysilicon 102 remains in the storage node plug contact areas 96 to be formed subsequently into plugs. This polysilicon etch stops at the BPSG material 82.

Figure 1L:
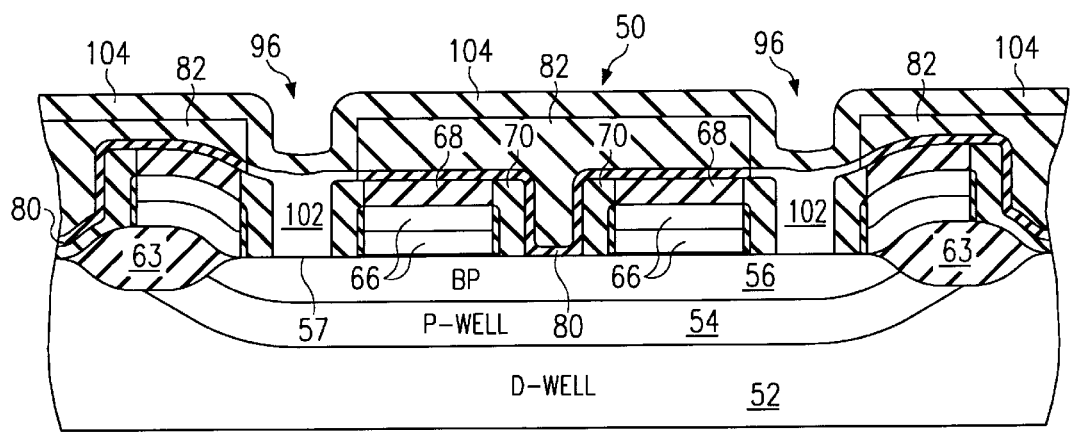
FIG. 1L is a cross-section of the part of FIG. 1K following a deposition of an overall layer of silicon oxide from TEOS.

FIG. 1L shows the cross-section of the integrated circuit device 50 after an oxide deposition 104 over the BPSG material 82 and the remaining polysilicon 102. Since the oxide deposition 104 and the BPSG material are both oxides, hereinafter they are treated as one layer in both the subsequent figures and in descriptive text. That one layer is referred to as the BPSG material 82.

Figure 1M:
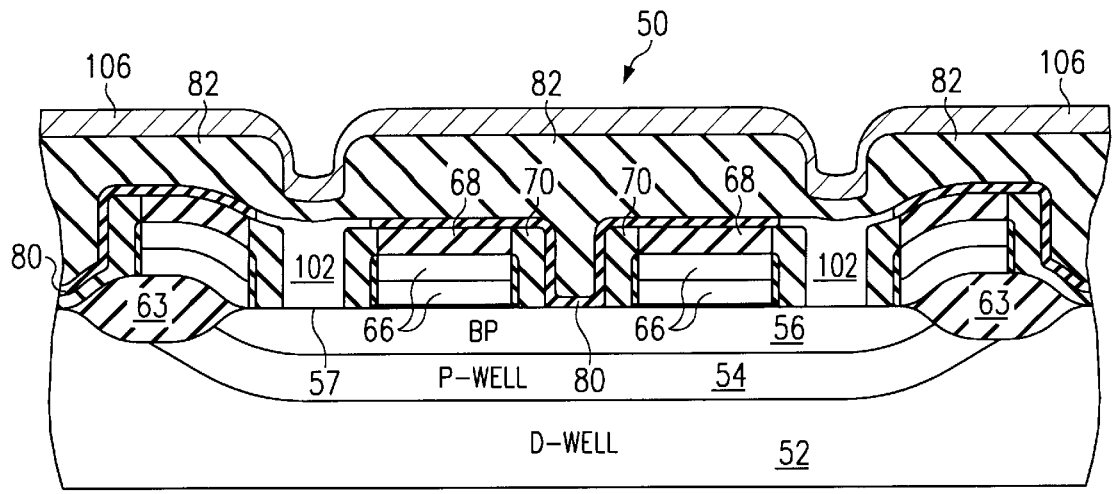
FIG. 1M is a cross-section of the part of FIG. 1L after a layer of polysilicon is deposited over all of the oxide.

FIG. 1M presents the cross-section of the device 50 after a layer of polysilicon 106 is deposited over the layer of BPSG material 82.

Figure 1N:
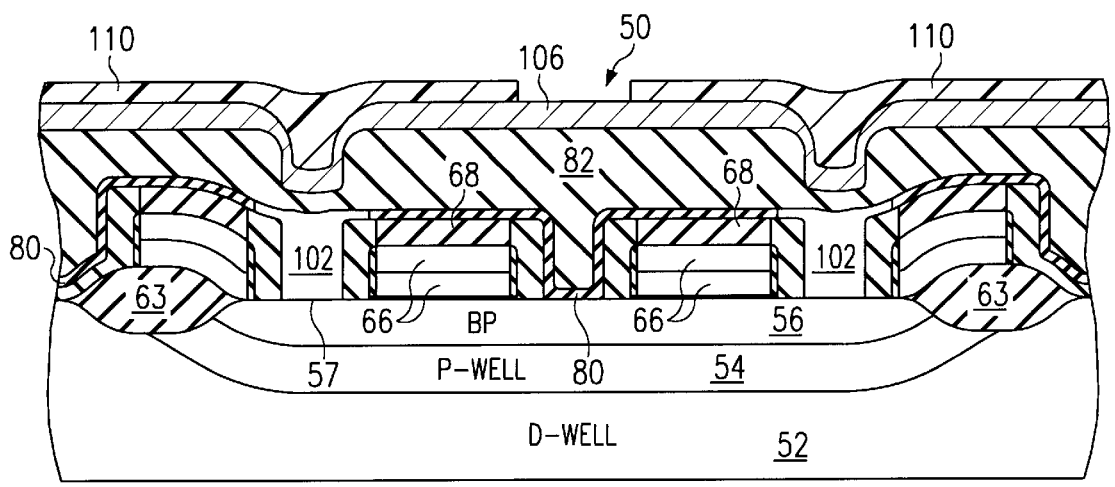
FIG. 1N is a cross-section of the part of FIG. 1M with a photoresist mask patterned on top of the layer of polysilicon.

In FIG. 1N, there is shown a photoresist mask 110 that is deposited over the polysilicon 106 and patterned for opening a hole for a bitline contact with the surface 57 of the substrate 52.

Figure 1O:
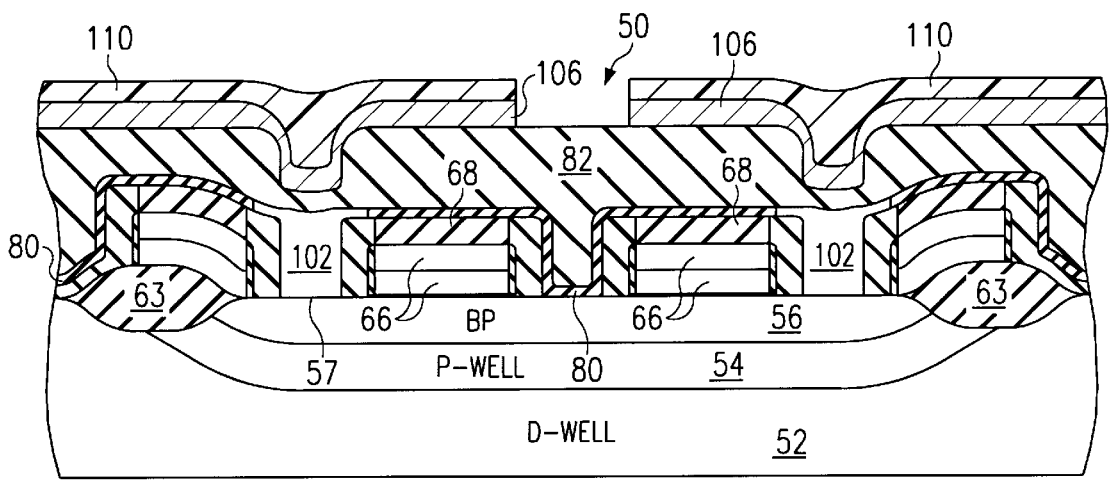
FIG. 1O is a cross-section of the part of FIG. 1N following a dry etch of the polysilicon to form a hard mask.

Referring now to FIG. 1O, the mask 110 is used for the next step which is a polysilicon dry etch through the layer of polysilicon 106 to the top surface of the BPSG material 82.

Figure 1P:
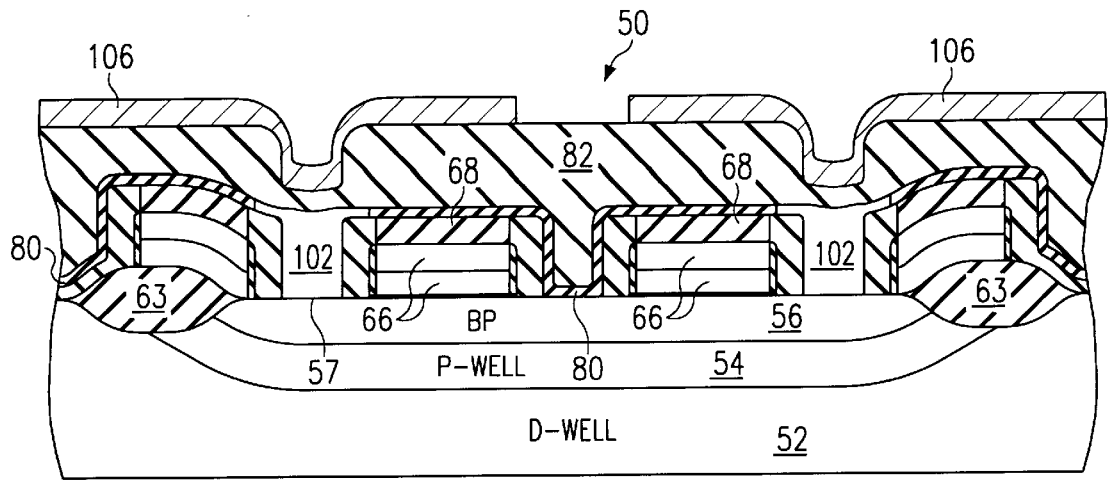
FIG. 1P is a cross-section of the part of FIG. 1O after the photoresist mask is removed leaving the polysilicon hard mask.

In FIG. 1P, there is shown the cross-section of the integrated circuit device 50 following removal of the photoresist mask 110 of FIG. 1O. Thus the integrated circuit device 50 is left with a hard mask of the polysilicon 106. A hole through the hard mask forms a pattern for etching a hole within which a bitline contact is to be formed subsequently.

Figure 1Q:
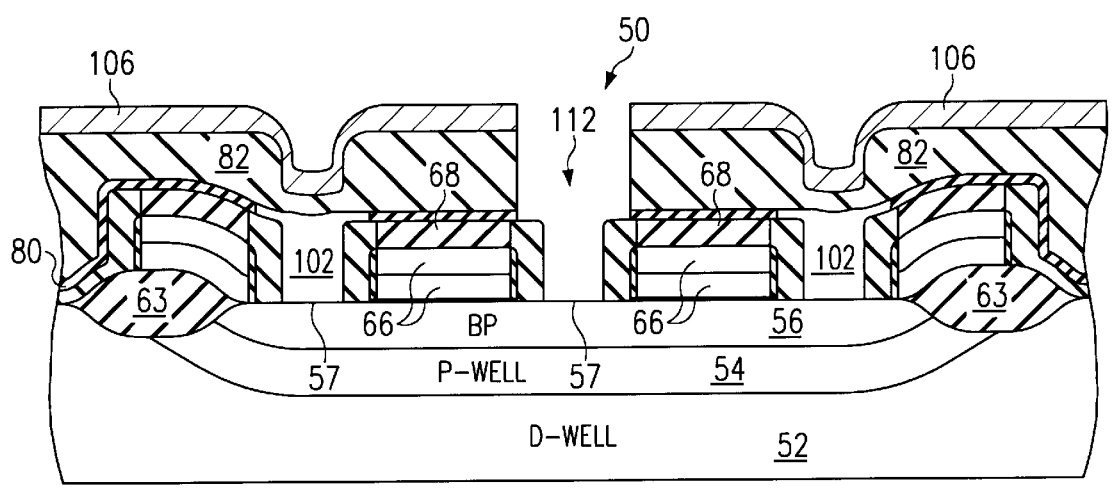
FIG. 1Q is a cross-section of the part of FIG. 1P following an anisotropic dry etch of the silicon oxides to form a bitline contact hole.

FIG. 1Q shows the cross-section of the device 50 after an anisotropic silicon oxide dry etch step is performed. The silicon oxide 82 is etched out down to the surface 57 of the semiconductor substrate 52 so that a bitline can be fabricated to connect with the substrate. Once this resulting bitline contact hole 112 is opened, the bitline can be fabricated. It is noted that the silicon nitride sidewalls of the bitline contact hole 112 are maintained with substantially square shoulders. Thus the silicon nitride 80 remains the desired thickness to provide sufficient insulation to prevent shorting between the conductive materials 66 and the bitline to be fabricated. This silicon oxide dry etch is similar to the two step described in regard to the step of FIG. 1I.

Figure 1R:
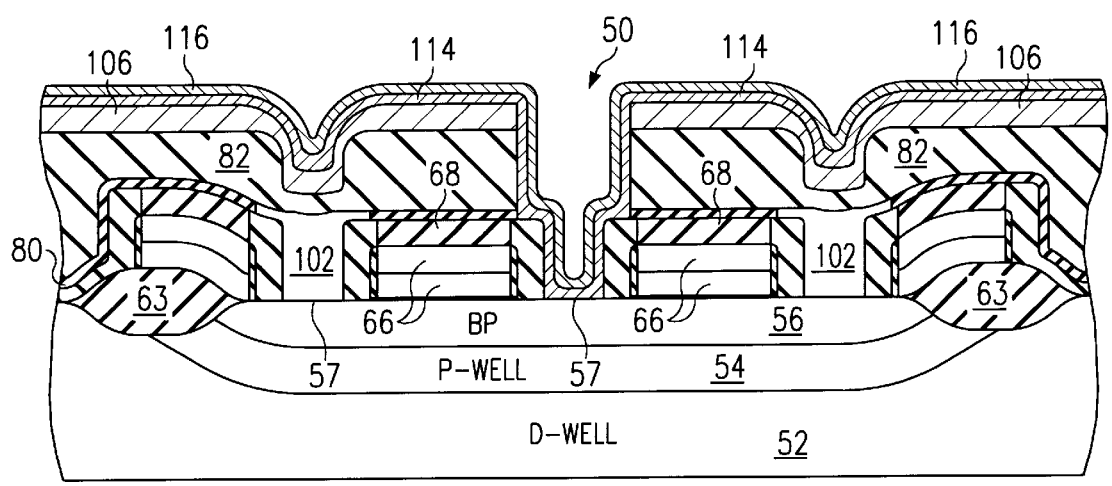
FIG. 1R is a cross-section of the part of FIG. 1Q after conductive materials are deposited overall.

Referring now to FIG. 1R, the cross-section of the integrated circuit device 50 includes two additional layers of material laid on top of the hard mask 106. First of all a layer of polysilicon 114 is deposited overall. In particular, the polysilicon 114 is deposited at the bottom of the bitline contact hole 112 where it is in contact with the surface 57 of the semiconductor substrate 52. On top of the layer of polysilicon 114, there is deposited overall a layer of tungsten silicide 116. This layer of tungsten silicide 116 is deposited on the polysilicon down into the bitline contact hole.

Figure 1S:
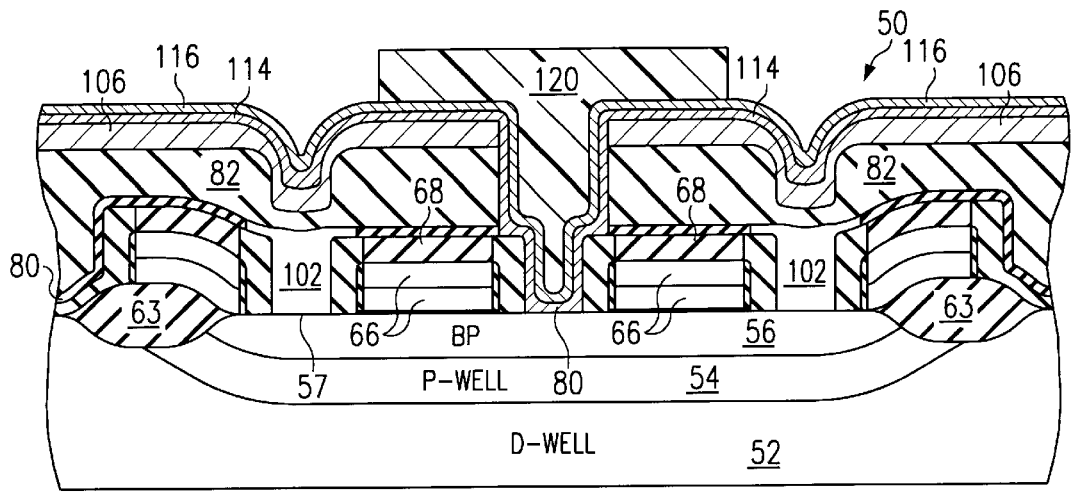
FIG. 1S is a cross-section of the part of FIG. 1R following the formation of a photoresist mask to shape the bitline.

FIG. 1S shows photoresist 120 laid on top of the layer of tungsten silicide 116 and patterned to form a bitline structure including the tungsten silicide 116 and the two layers of polysilicon 114 and 106. The resulting bitline connects with a source/drain region at the surface 57 of the substrate.

Figure 1T:
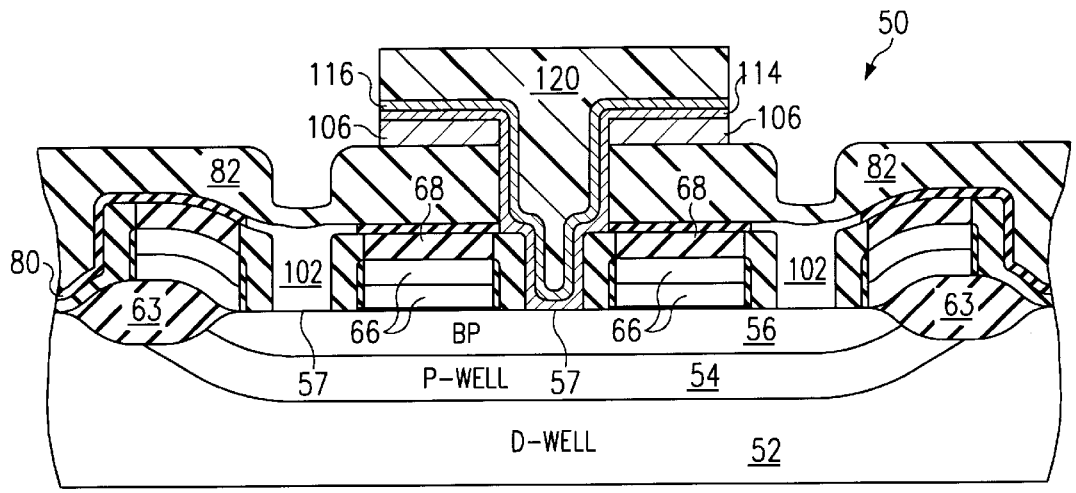
FIG. 1T is a cross-section of the part of FIG. 1S after layers of tungsten silicide and polysilicon are etched away leaving a shaped bitline.

Referring, now to FIG. 1T, there is shown the cross-section of the device 50 following tungsten and polysilicon dry etching. The layer of tungsten silicide 116, the layer of polysilicon 116 and the polysilicon hard mask 106 are all etched away leaving the bitline structure under the photoresist 120.

Figure 1U:
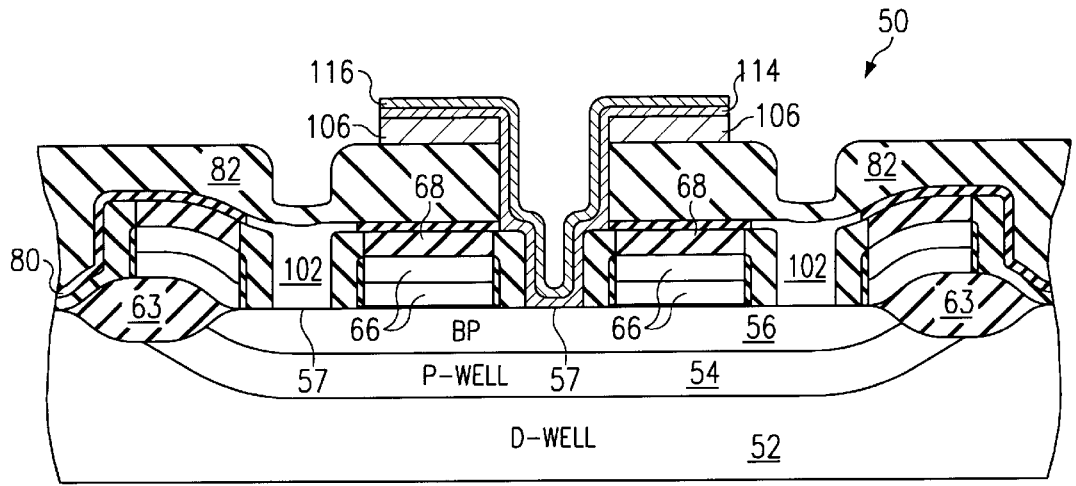
FIG. 1U is a cross-section of the part of FIG. 1T following the removal of the photoresist mask.
Figure 20:
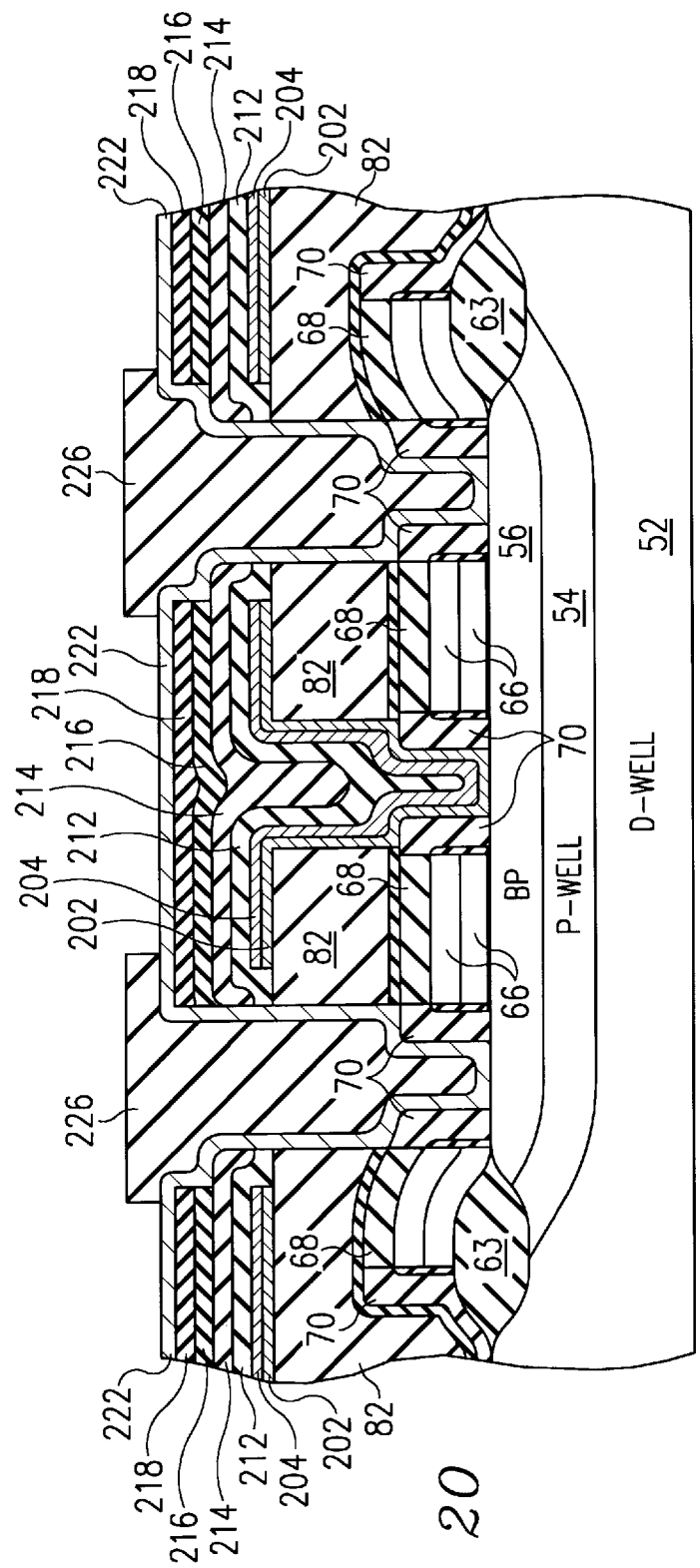

As shown in FIG. 1U after the bitline is formed, the next step is to remove the photoresist 120 of FIG. 20 from the top of the bitline structure.

Figure 1V:
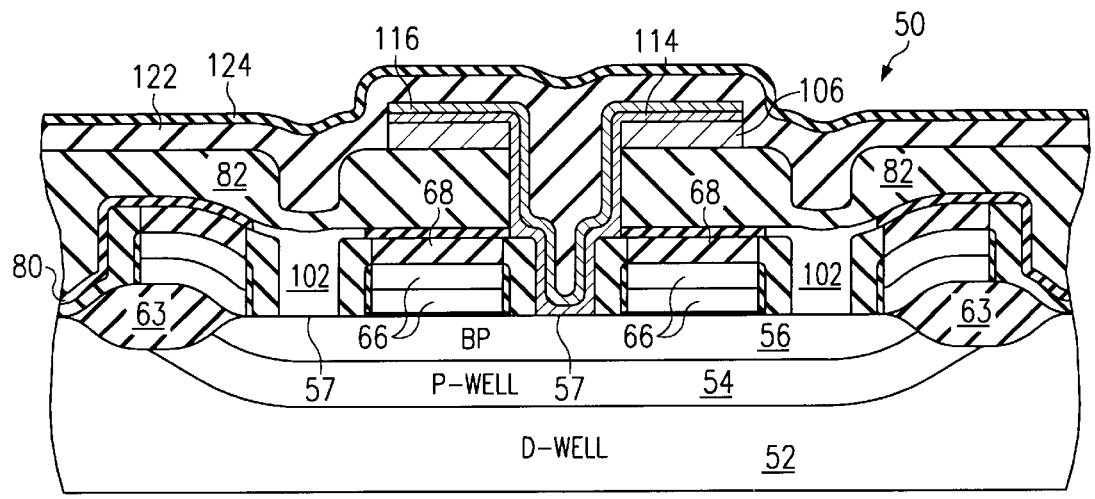
FIG. 1V is a cross-section of the part of FIG. 1U after TEOS and silicon nitride depositions are made overall.

FIG. 1V shows the result after the next two processing steps. Insulating material is deposited over the entire top surface in two steps. In the first of those steps, a layer of silicon oxide 122, approximately 1000 A thick, is deposited from TEOS overall of the top of the device 50. Secondly, a layer of silicon nitride 124, approximately 250 A thick, is deposited on top of the layer of silicon oxide 122. Together these two layers of material form the insulating material which covers the entire bitline structure.

Figure 1W:
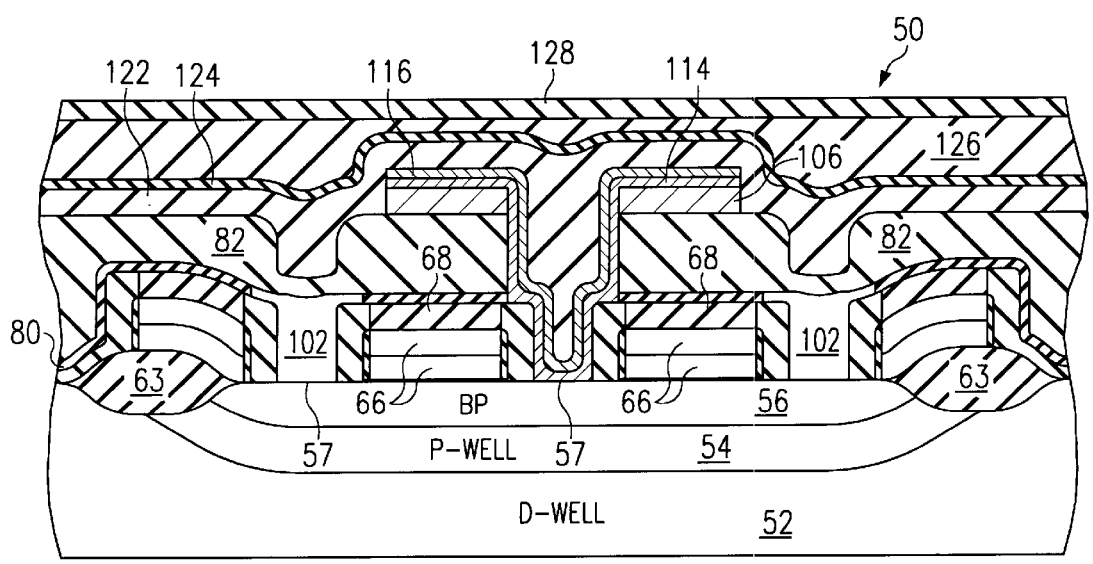
FIG. 1W is a cross-section of the part of FIG. 1V following a BPSG deposition and etch back and a TEOS deposition.

In FIG. 1W, there is shown the result after depositing another layer of silicon oxide 126, approximately 5000 A thick, over all of the device 50. Then the device is annealed at approximately 850° C. for about twenty minutes. The layer of silicon oxide 126 is etched back leaving some 500 A of the layer with a relatively flat top surface. Then a layer of silicon oxide 128 is deposited overall from TEOS to a thickness of approximately 500 A.

Figure 1X:
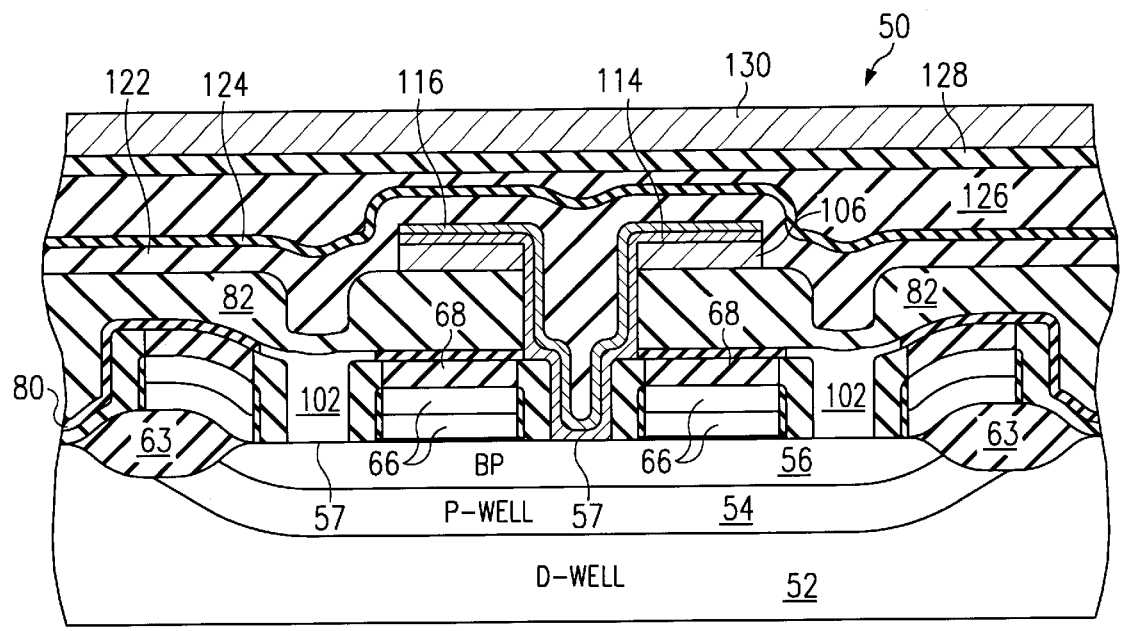
FIG. 1X is a cross-section of the part of FIG. 1W after polysilicon is deposited overall.

Subsequently, as shown in FIG. 1X, a layer of polysilicon 130 is deposited to a thickness of approximately 2000 A over all of the device 50.

Figure 1Y:
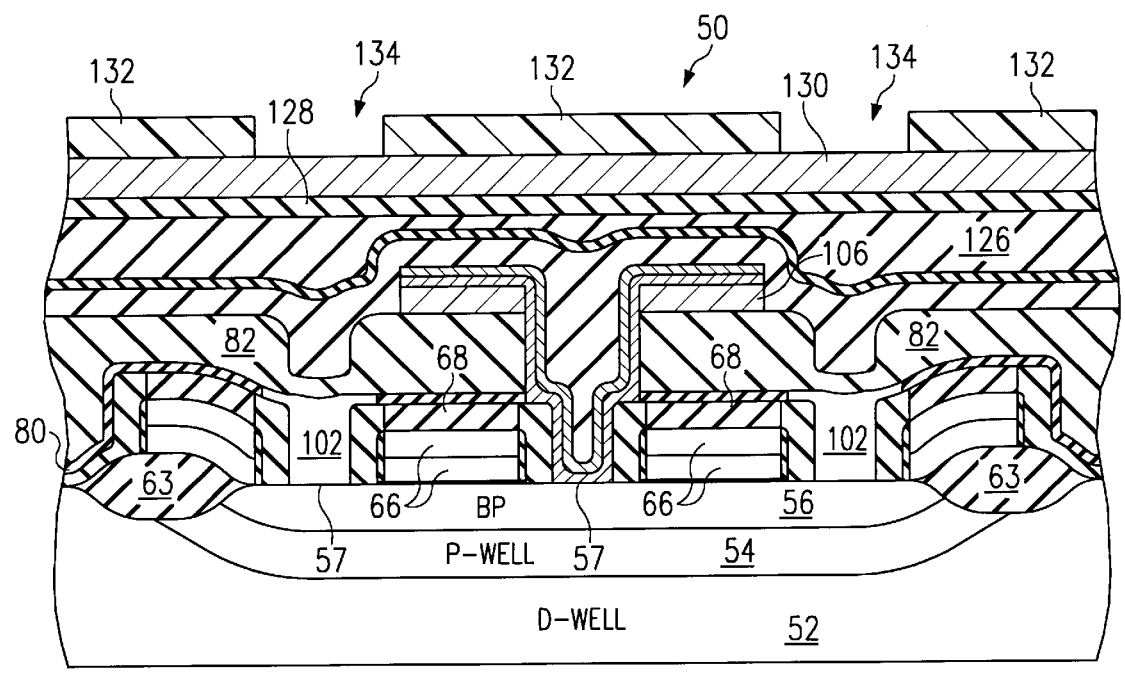
FIG. 1Y is a cross-section of the part of FIG. 1X following the formation of a photoresist mask for opening holes for connections to the storage node contact plugs.

As shown in FIG. 1Y, a photoresist mask 132 is deposited and formed to locate openings 134 for storage capacitor contacts to the storage node contacts 102.

Figure 1Z:
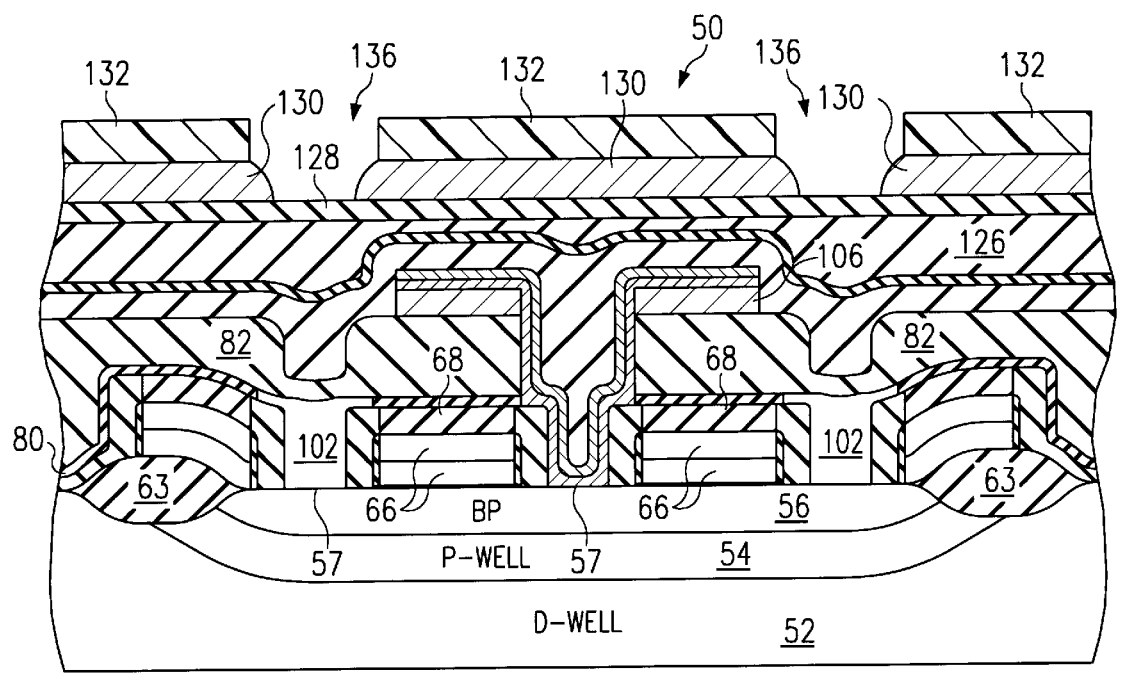
FIG. 1Z is a cross-section of the part of FIG. 1Y subsequent to the dry etching of the polysilicon to form a hard mask under the photoresist mask.
Figure 1A:
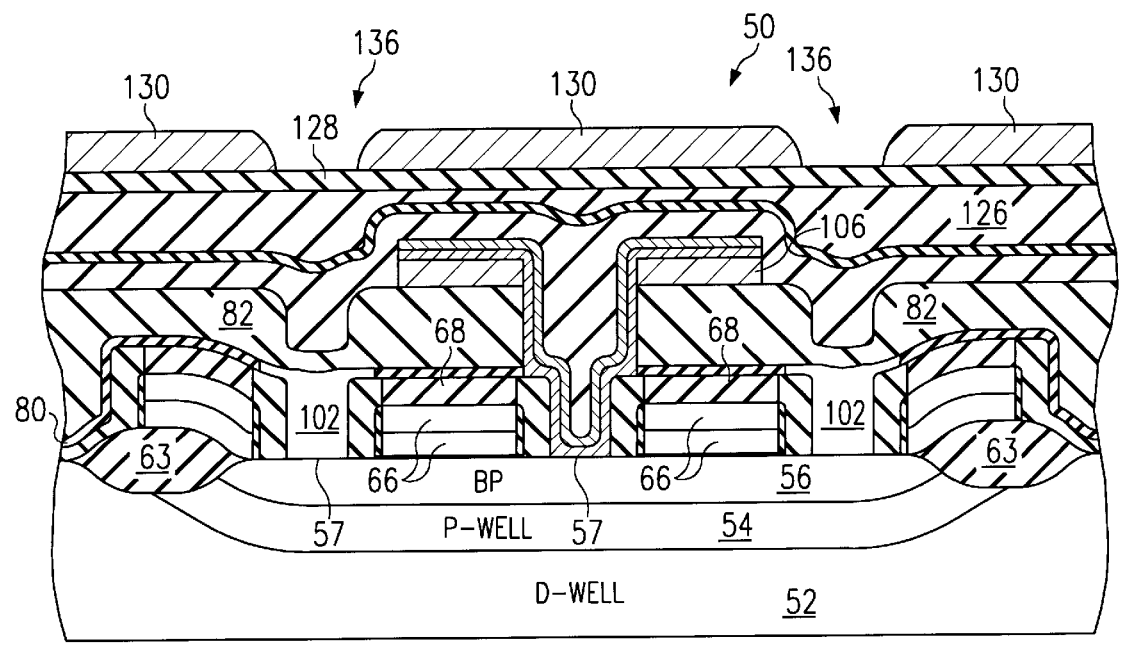
Figure 1A:
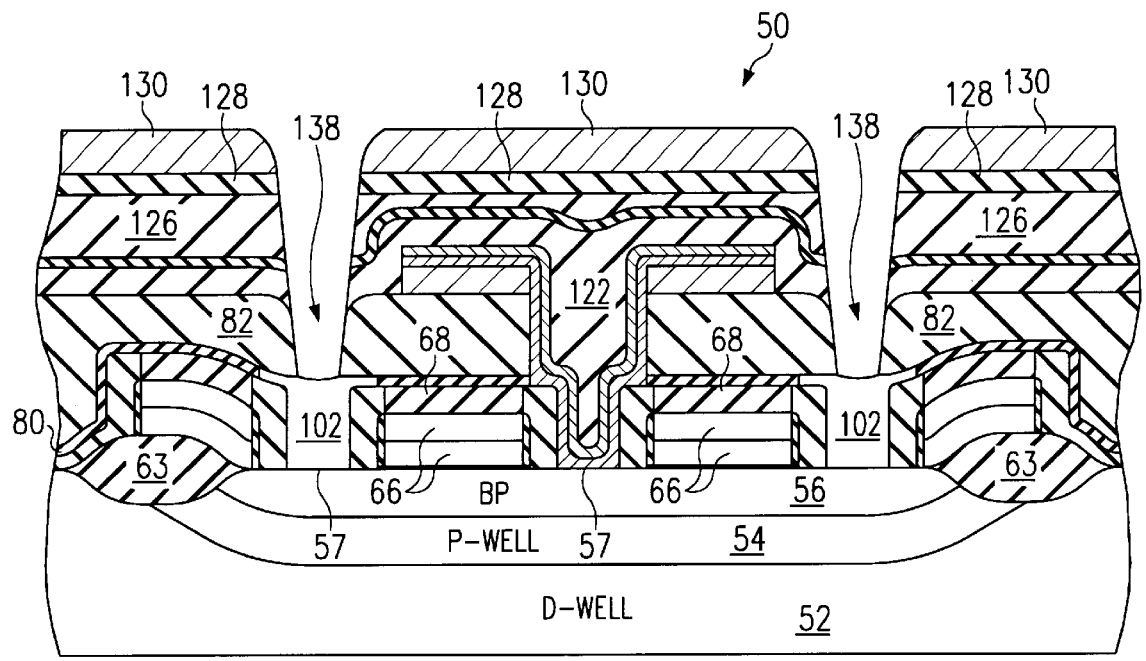
Figure 1A:
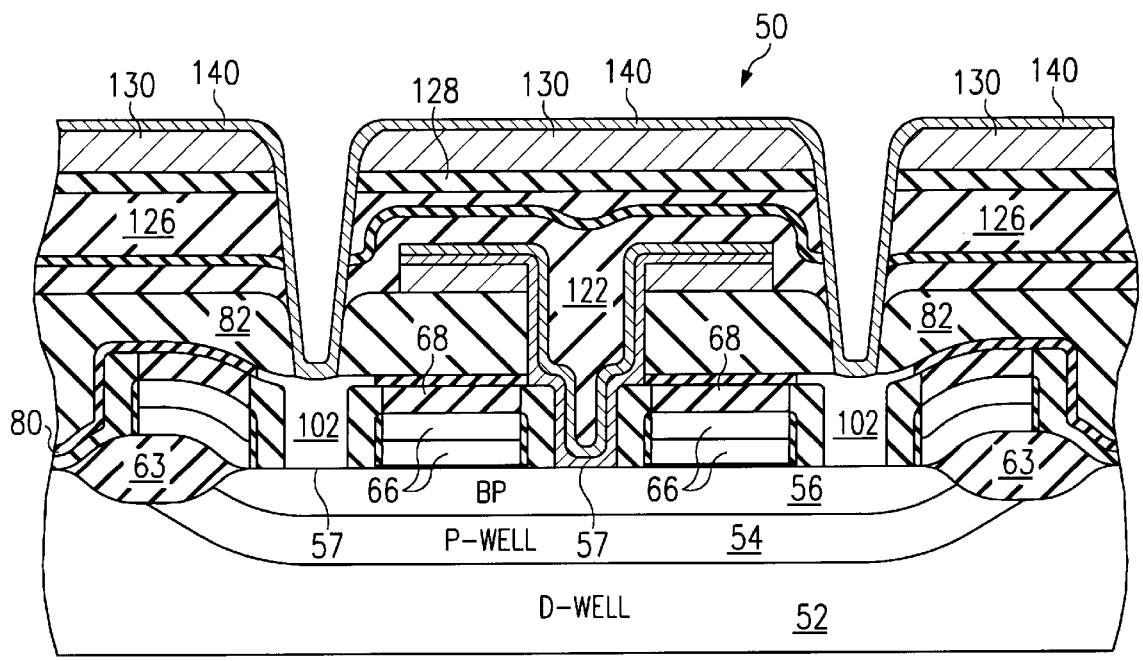
Figure 1A:
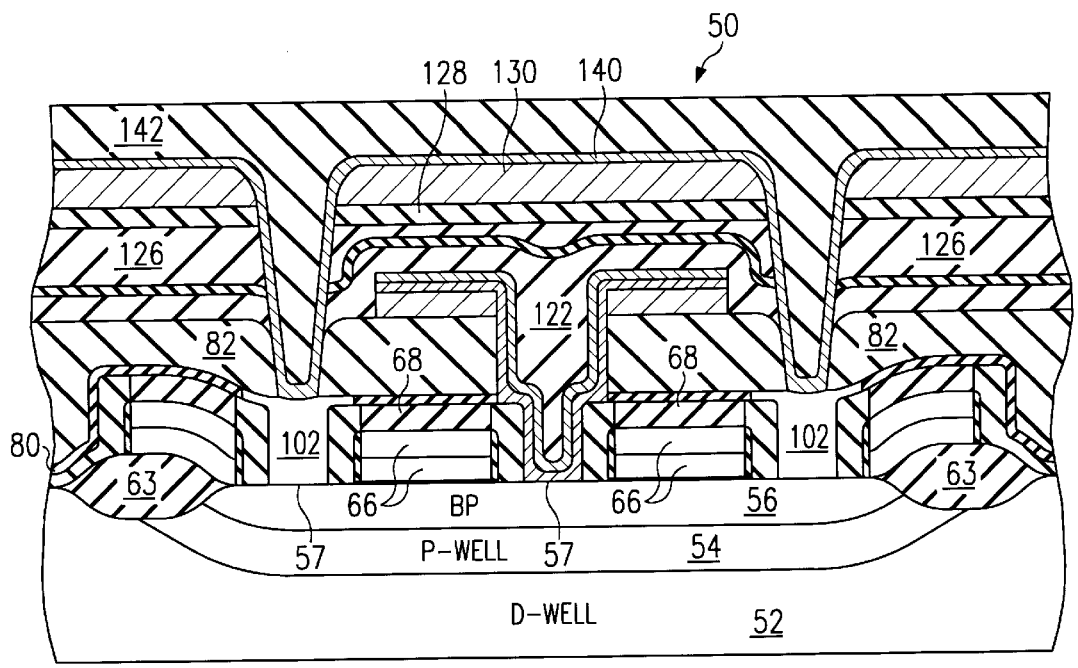
Figure 1A:
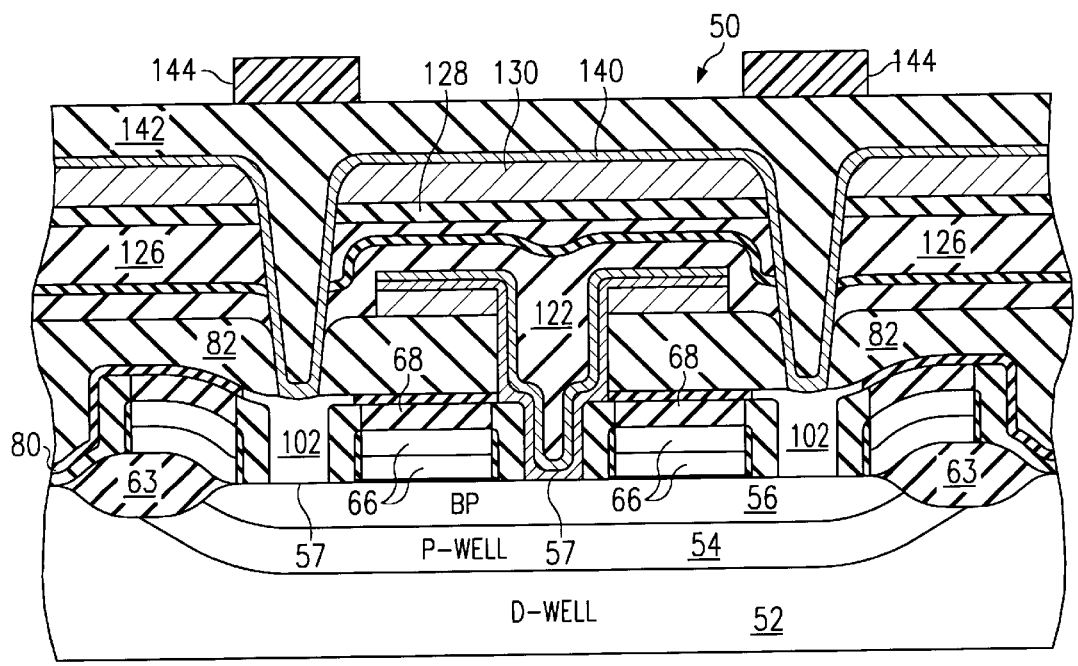
Figure 1A:
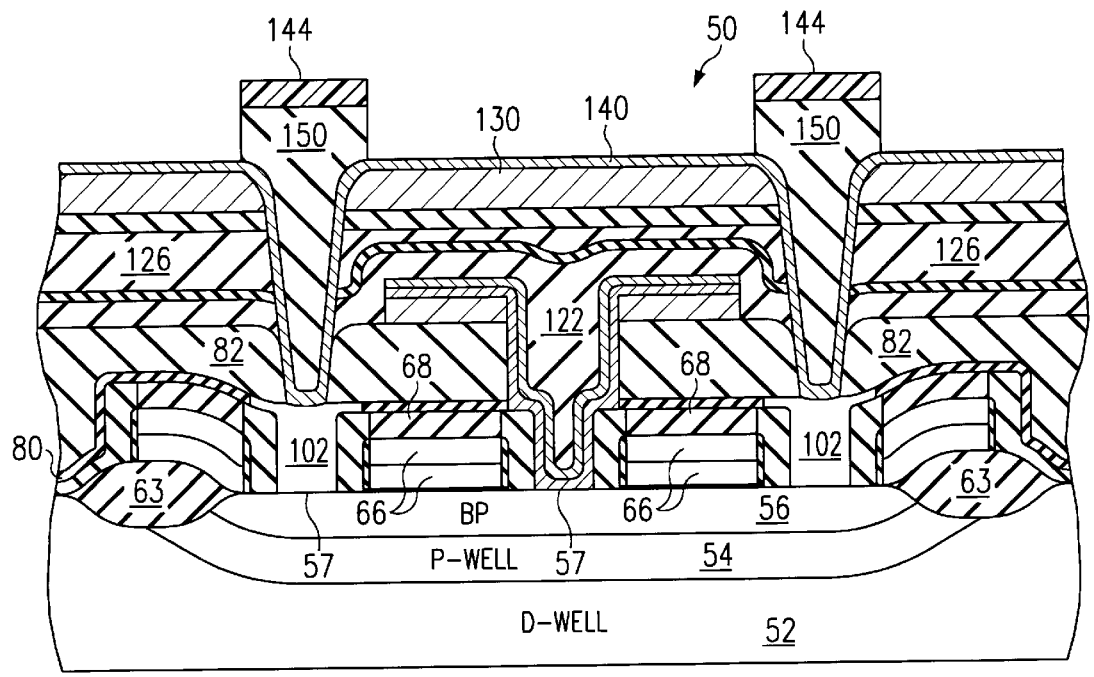
Figure 1A:
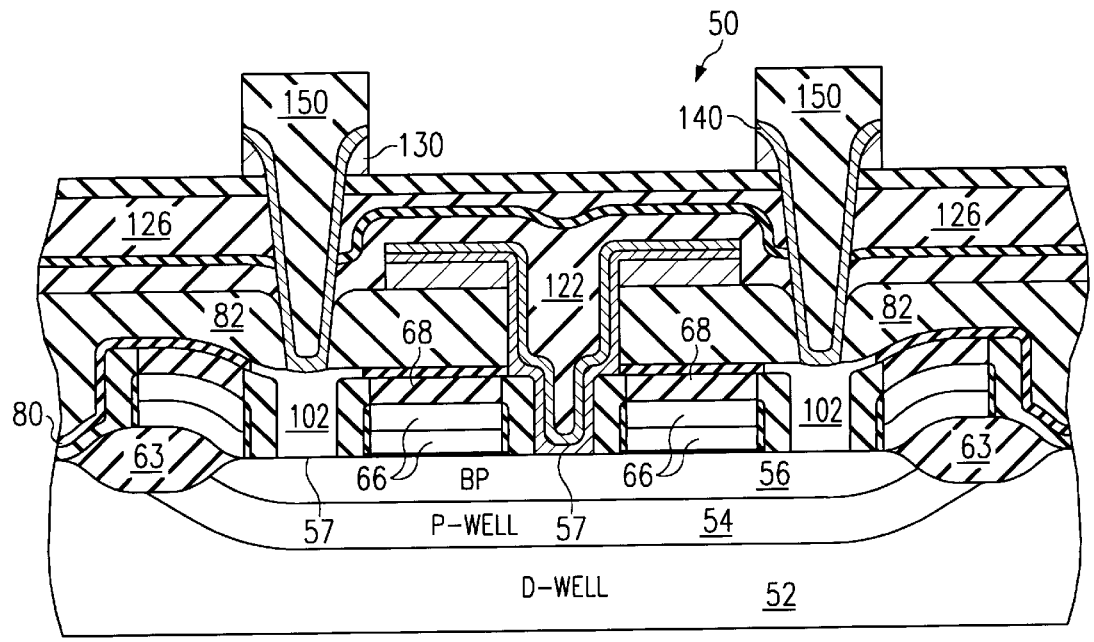
Figure 1A:
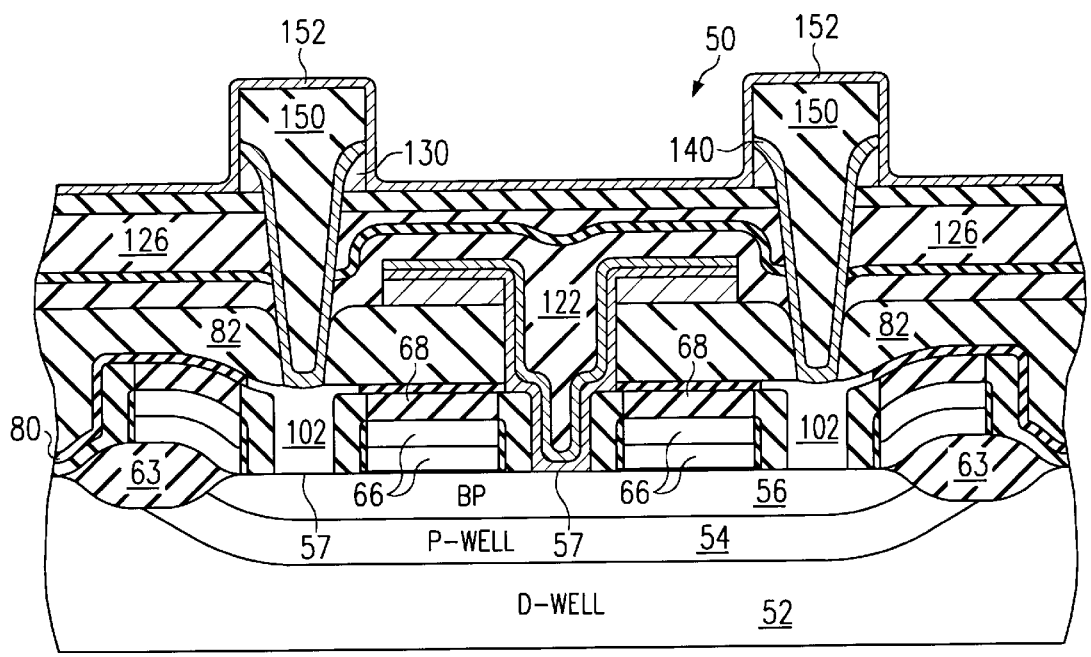
Figure 1A:
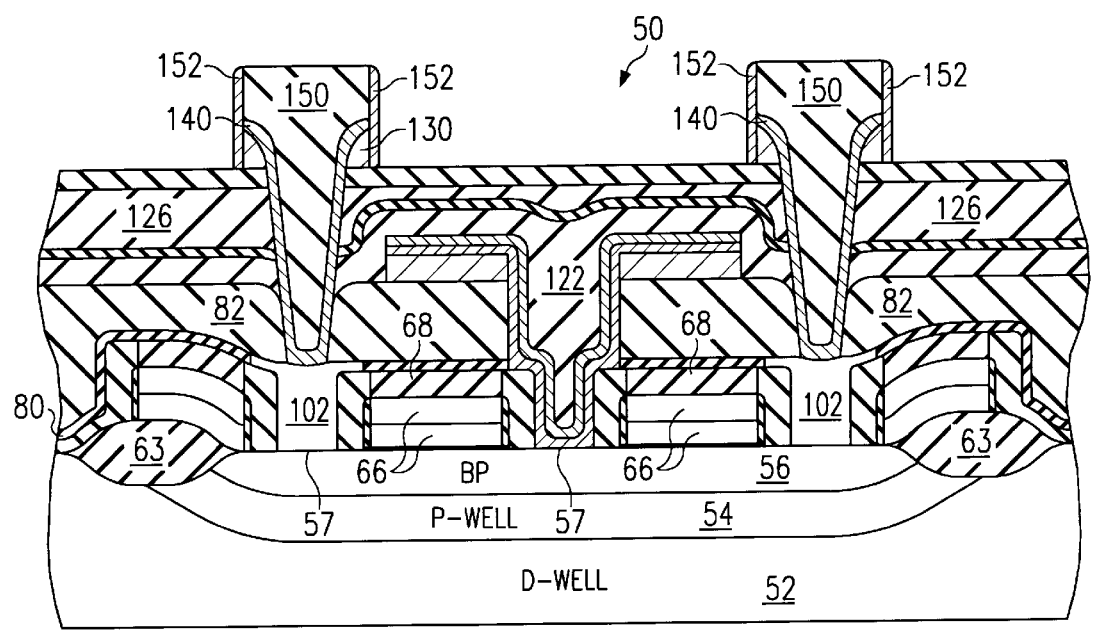
Figure 1A:
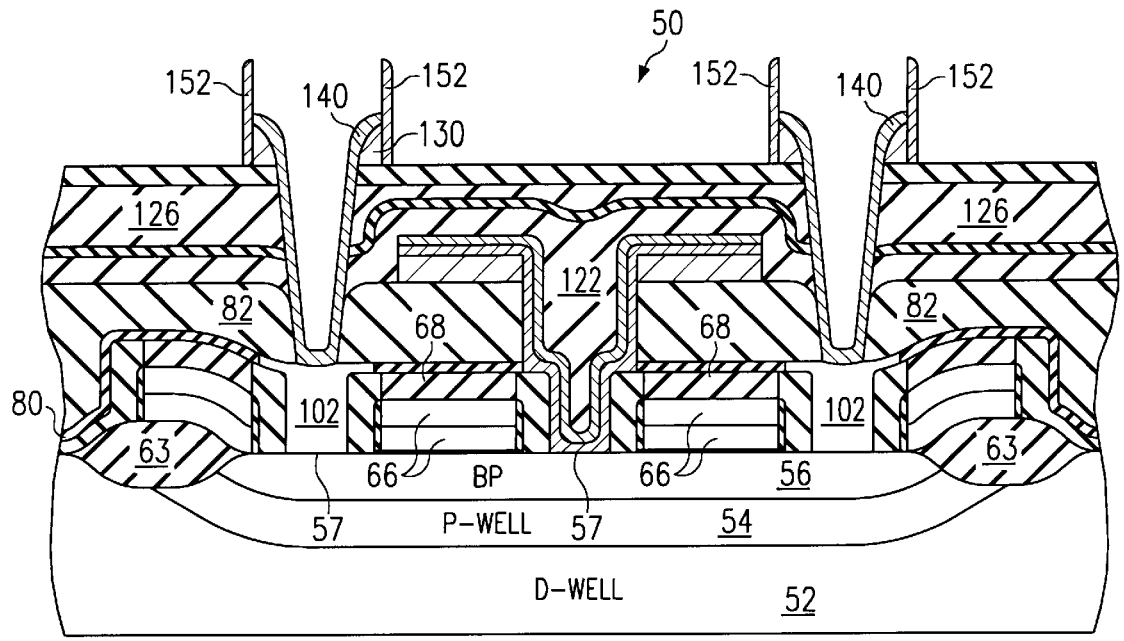
Figure 1A:
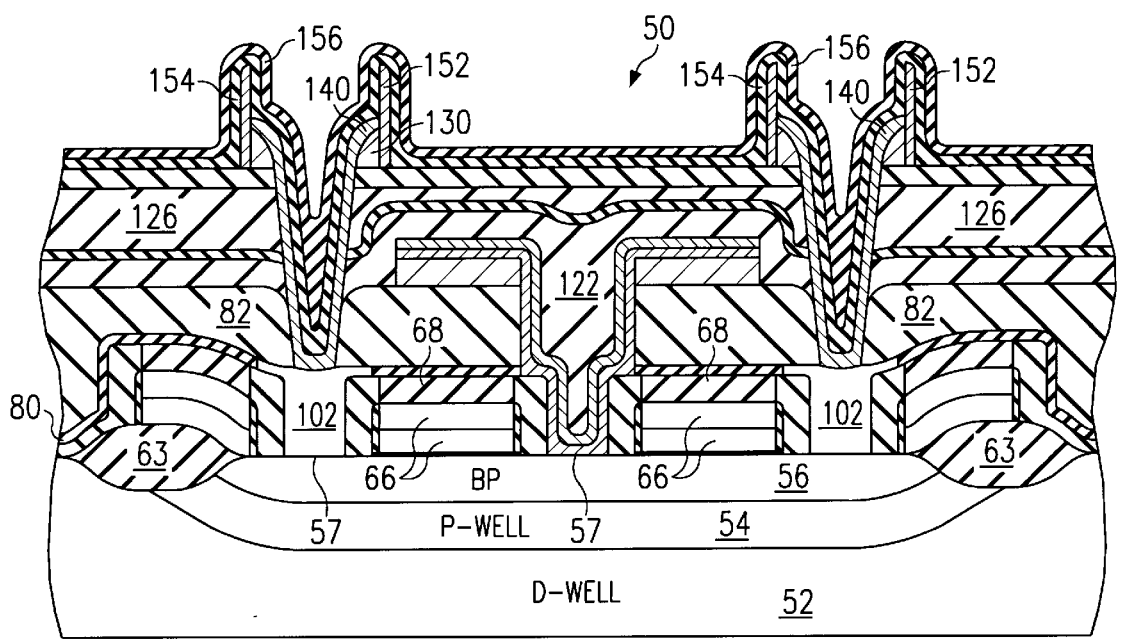
Figure 1A:
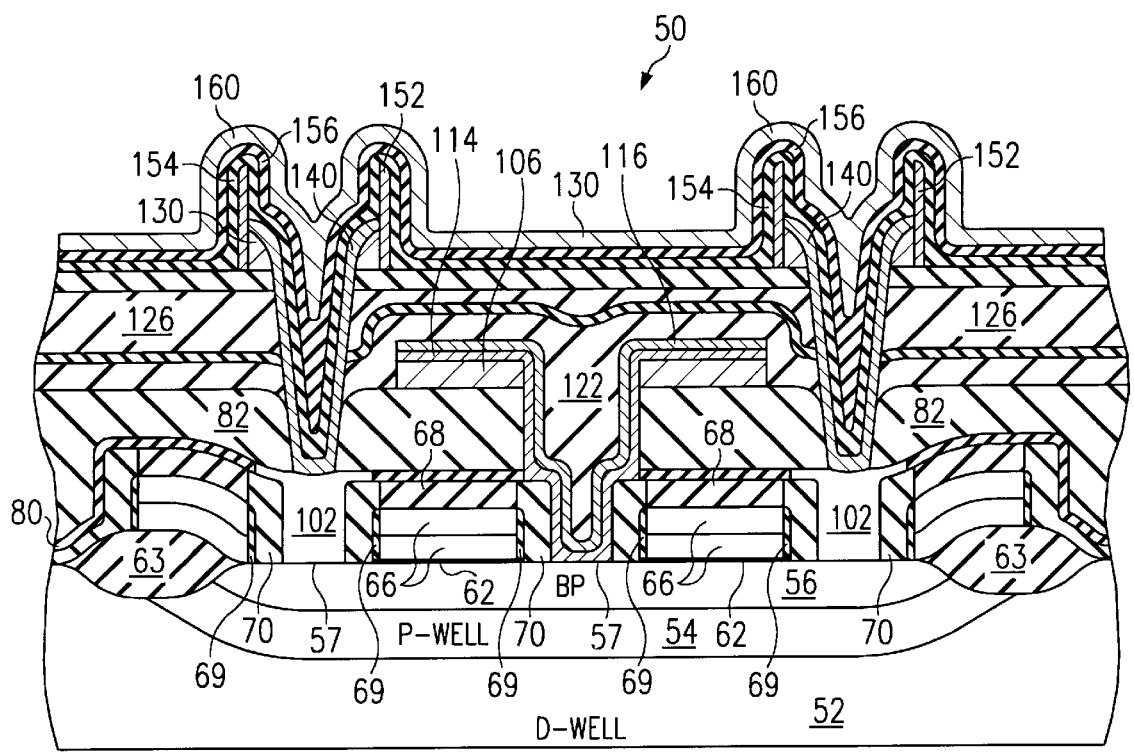

In FIG. 1Z, there is shown the cross-section of the device 50 following a polysilicon dry etch that opens holes 136 through the layer of polysilicon 130 for subsequent processing and fabrication of the storage capacitor contacts with the storage node contacts 102.

Referring now to FIG. 1AA, the cross-section of the device 50 is shown after the photoresist mask 132 of FIG. 12 is removed. The layer of polysilicon remains in the form of a hard mask with openings, or holes, 136 for opening holes through the oxide below to make storage capacitor connections with the storage node plugs 102.

FIG. 1AB shows the resulting cross-section of the device 50 following a dry etch of silicon dioxide. The etch produces holes 138 down below the holes in the hard mask 130 all of the way to the top surfaces of the storage node plugs 102. This etch is similar to the two step etch described in regard to the step of FIG. 1I.

In FIG. 1AC, there is shown a layer of polysilicon 140 deposited to a thickness of approximately 700 A all over the top of the device 50 of FIG. 1AB.

Referring now to FIG. 1AD, a layer of silicon oxide 142 is deposited to a thickness of approximately 5000 A over all of the top surface of the device 50 from TEOS.

As shown in FIG. 1AE, a photoresist mask 144 is deposited and formed on the top of the layer of silicon oxide 142.

FIG. 1AF shows the cross-section of the device 50 following a dry etch of the layer of silicon oxide 142 leaving the photoresist material 144 on top of the mesas 150 of the silicon oxide.

Referring now to FIG. 1AG, the cross-section shows the device 50 after the photoresist mask is removed from the tops of the silicon oxide mesas 150.

As shown in FIG. 1AH, a layer of conductive polysilicon 152 is deposited over all of the top surface of the device 50 of FIG. 1AG. Thus the layer of polysilicon covers the tops and sidewalls of the mesas 150. Between the mesas 150 and other areas, the polysilicon 152 is in contact with the layer of polysilicon 140 that is connected with the storage node contact plugs 102.

FIG. 1AI is a cross-section of the part of FIG. 1AH following an etch back of the layer of polysilicon 152. It is noted that the polysilicon is etched off of the tops of the mesas 150 and away from the horizontal surfaces between mesas. The etch back process leaves the sidewall covering of polysilicon on each of the mesas 150. These sidewalls of polysilicon 152 are connected through the layer of polysilicon 140 to the storage node contact plugs 102.

Referring now to FIG. 1AJ, the cross-section shows the part of FIG. 1AI after a silicon oxide etch. This etch removes all of the silicon oxide of the mesas 150, all of the silicon oxide down into the cavity surrounded by the layer of polysilicon 140, and all of the silicon oxide between the sidewalls of the polysilicon 152. Once the silicon oxide is removed, the remaining polysilicon 140, 152 forms a conductive storage node that has a cross-section shaped like the cross-section of a torch.

FIG. 1AK shows a cross-section of the part of FIG. 1AJ following deposition of an insulting layer of silicon nitride 154. After the layer of silicon nitride 154 is deposited, the device 50 is subjected to an oxidation process step to form a layer of silicon oxide 156 on top of the layer of silicon nitride 154.

As shown in FIG. 1AL, the cross-section of the part of FIG. 1AK has a layer of conductive polysilicon 160 deposited over the top of all. At this point in the succession of process steps, there is the layer of conductive polysilicon 160 separated by the insulating layers of silicon nitride 154 and silicon oxide 156 from the conductive storage node polysilicon 140, 152. Thereafter the layer of polysilicon 160 can be formed into a field plate.

Advantageously, the foregoing processing steps have completed the fabrication of a bitline structure 106, 114, 116 connected with the substrate surface 57. This bitline structure is separated by an insulating silicon nitride sidewall 70 from the conductive wordline structure 66. Also completed is the fabrication of the storage capacitor structures 102, 140, 152, 154, 156, 160, the conductive contact plugs 102 thereof also being connected with the substrate surface 57. The bitline layer 114 and the storage node contact plugs 102 are all separated by the layer of sidewall silicon nitride 70 from the conductive wordline structures 66. Sidewall silicon nitride 70 has relatively square top corners and sufficient thickness to effectively insulate the bitline and the storage node contact plugs from the wordline structure without undesirable shorting during operation.

The process of fabricating a complete integrated circuit memory device continues from this last mentioned step.

The just described process produces a very advantageous structure within the integrated circuit device being fabricated.

An alternative exemplary sequence for fabrication also can be used to produce the desired integrated circuit device. The alternative exemplary sequence can be characterized as a fabrication sequence for creating storage node contacts in a single step. That is a single mask, etch, and deposition of a conductor, as the storage node contact. This alternative sequence is to be described directly hereinafter.

The first steps of the process proceed just like the steps disclosed in FIGS. 1A–1E that were just described. The advantageous silicon nitride etch which leaves the square shoulders and vertical sidewalls in the silicon nitride is included in those first steps. The process proceeds after the step of FIG. 1E.

Figure 2A:
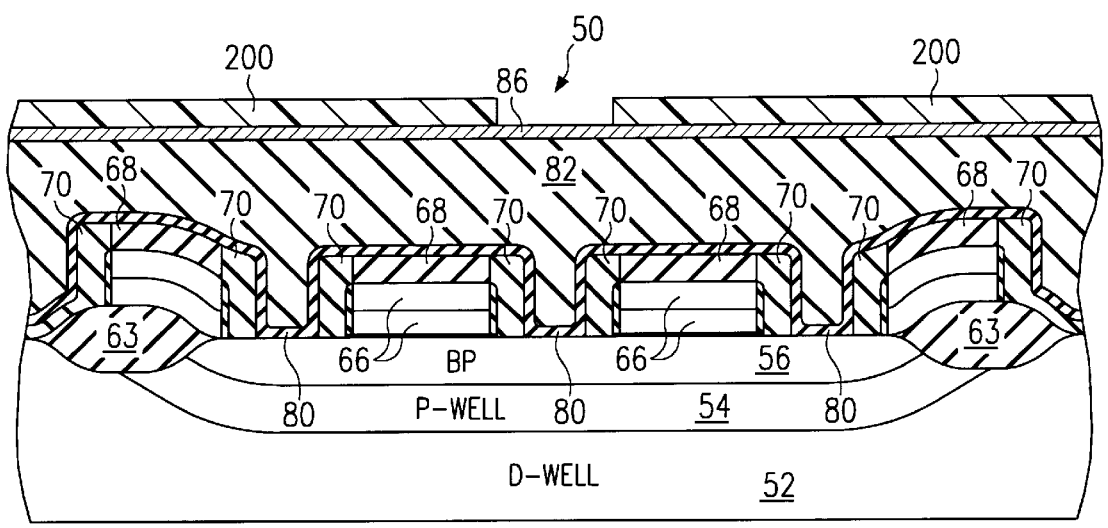
FIG. 2A shows a cross-section of the part of FIG. 1E after a photoresist mask is formed on top of the layer of boron phosphorous silicon glass to shape a bitline contact hole.

Referring now to FIG. 2A, there is shown a cross-section of the device 50 after the thin layer of polysilicon 86 is laid over the oxide 82. Then a layer of photoresist 200 is formed into a photomask for etching a hole for a bitline contact.

Figure 2B:
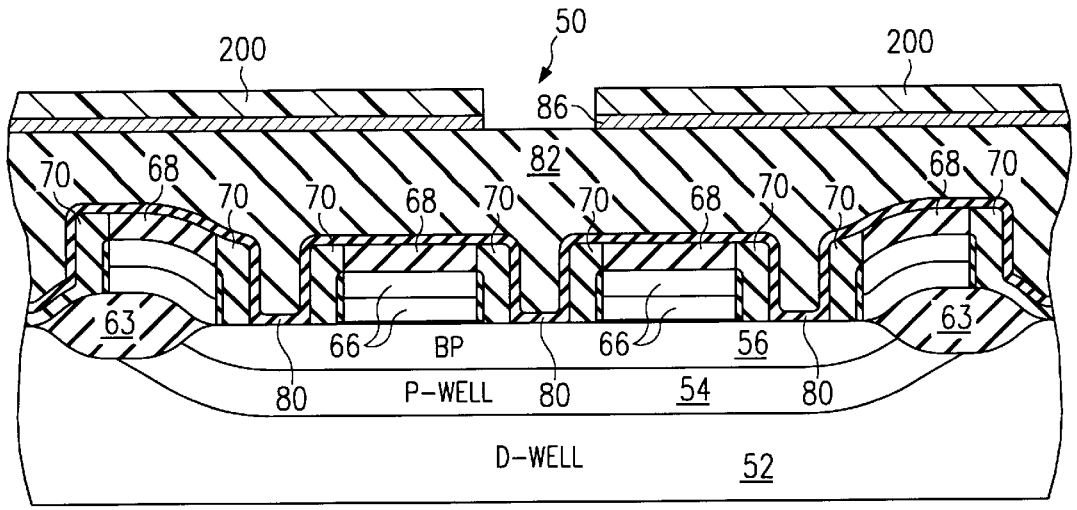
FIG. 2B shows a cross-section of the part of FIG. 2A following an etch through the layer of boron phosphorous silicon glass to make a hard mask for the bitline contact hole.

FIG. 2B shows the cross-section of the semiconductor device following an etch through the polysilicon 86, in a pattern, determined by the photoresist 200. This etch creates a polysilicon hard mask 86 lying over the oxide layer 82.

Figure 2C:
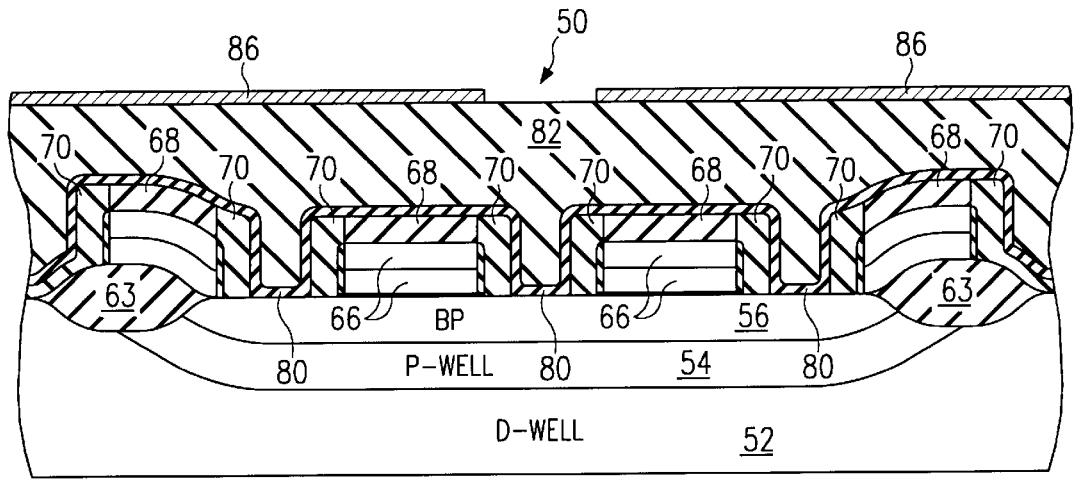
FIG. 2C is a cross-section of the part of FIG. 2B after removal of the photoresist.

In FIG. 2C, there is shown the cross-section of the integrated circuit being fabricated after the photoresist mask is removed. The hard mask 86 remains and is patterned to create the desired bitline contact. A mask opening for a single bitline contact is shown, but it is obvious that many other bitline contact openings can be made in other sections of the device, not shown.

Figure 2D:
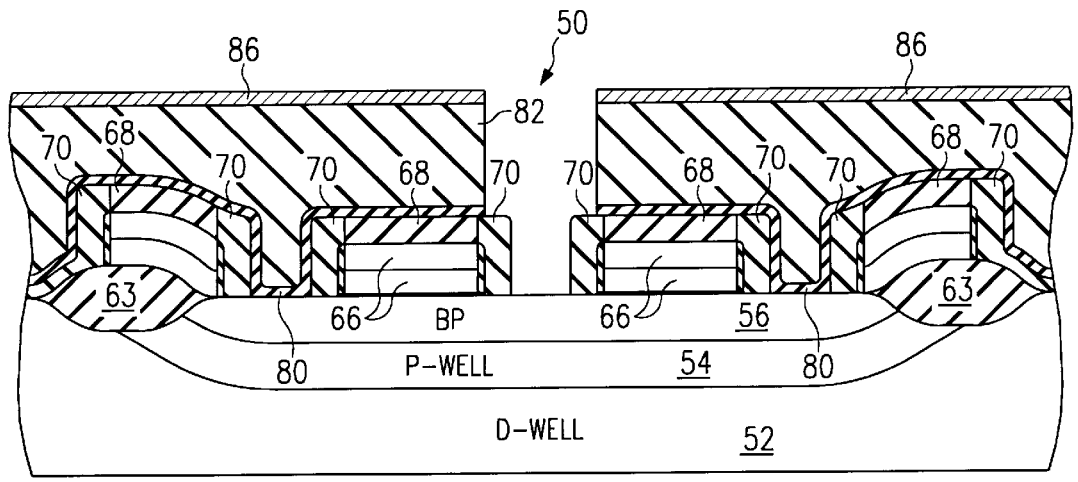
FIG. 2D shows a cross-section of the part of FIG. 2C following an oxide etch for a bitline contact hole.

Referring now to FIG. 2D, there is shown a cross-section of the device 50 being fabricated following a bitline contact, self-aligned oxide etch through the BPSG and TEOS to the top surface 57 of the semiconductor substrate. This oxide etch is an anisotropic dry etch which removes BPSG leaving vertical walls 90 therein and removes the silicon oxide deposited from the TEOS leaving vertical walls 92 of the underlying silicon nitride. The silicon oxide deposited from the TEOS is etched selectively from the underlying silicon nitride 70 leaving relatively square shoulders in the sidewall silicon nitride 70. Consequently, the resulting thickness of the sidewall and top silicon nitride 70 and 68 covering the stacked conductive layers 66 provides the desired insulation to prevent shorting between the stacked layers of conductive material 66 from the bitline contact to be fabricated. This oxide etching is accomplished in two etching steps.

For the first step of this oxide etch, the conditions are:

| Pressure | 100 | +/−20% | m torr |
|---|---|---|---|
| Gap | 11 | +/−10% | mm |
| Power | 0 | +/−20% | watts |
| CO | 150 | +/−20% | sccm |
| Ar | 600 | +/−20% | sccm |
| $C_4F_8$ | 2 | +/−20% | sccm |
| $CF_4$ | 5 | +/−20% | sccm |
| Backside pressure | | | |
| (center) | 20 | | torr |
| (edge) | 7.5 | | torr |

The bottom electrode is held at approximately 20mC. As a result of this first step, a substantial part of the silicon oxide is removed for the bitline contact hole.

For the second step etching through the oxide, the conditions are:

| Pressure | 100 | +/−20% | m torr |
|---|---|---|---|
| Gap | 11 | +/−10% | mm |
| Power | 1500 | +/−20% | watts |
| CO | 150 | +/−20% | sccm |
| Ar | 600 | +/−20% | sccm |
| $C_4F_8$ | 2 | +/−20% | sccm |
| $CF_4$ | 5 | +/−20% | sccm |
| Backside pressure | | | |
| (center) | 20 | | torr |
| (edge) | 7.5 | | torr |

The bottom electrode is held at approximately 20mC. As a result of this second step, the contact hole is etched down to the top surface of the semiconductor substrate. Any residue silicon oxide is removed. It is noted that argon is an inert gas and that helium or nitrogen can be substituted therefore.

This etch proceeds to etch away a region of the oxide layer 82 and part of the oxide layer 80, which are exposed by the bitline contact opening in the hard mask 86. It is noted that the layers 80 and 82 are etched right down to expose the top surface of the silicon substrate. Thus the bitline contact, to be fabricated, can connect directly with the top surface of the silicon substrate.

A significant advantage of square sidewall nitride, gives much more to the bitline contact etch as apparent in FIG. 2D. These square shoulders assure a desired minimum thickness of the silicon nitride 70 meets or exceeds the desired electrical separation of the conductive layers 66 from the conductive bitline contact to be fabricated in the bitline contact hole.

Figure 2E:
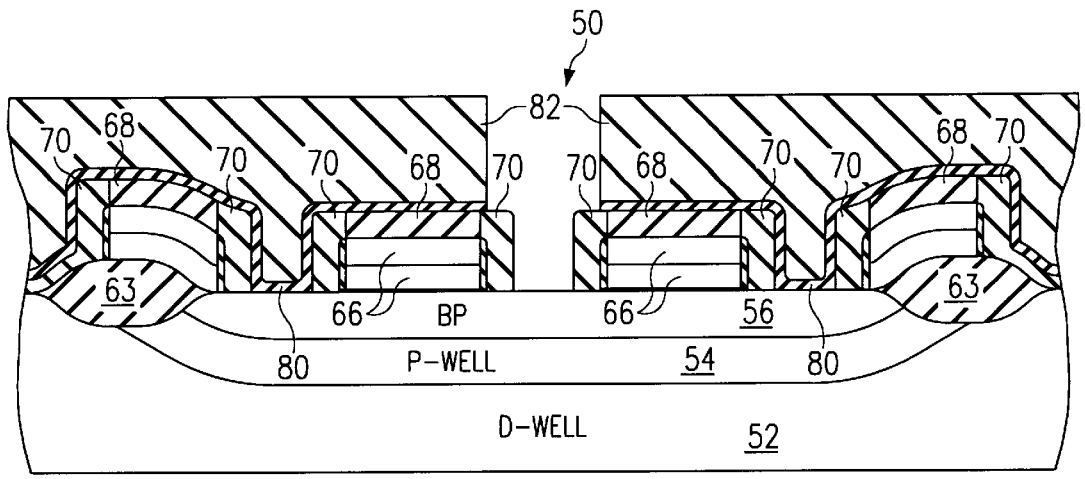
FIG. 2E presents the cross-section of the part of FIG. 2D following an etch that removes the layer of boron phosphorous silicon glass.

FIG. 2E, the cross-section of the device 50 is shown after the hard mask material 86 of FIG. 2D is removed.

Figure 2F:
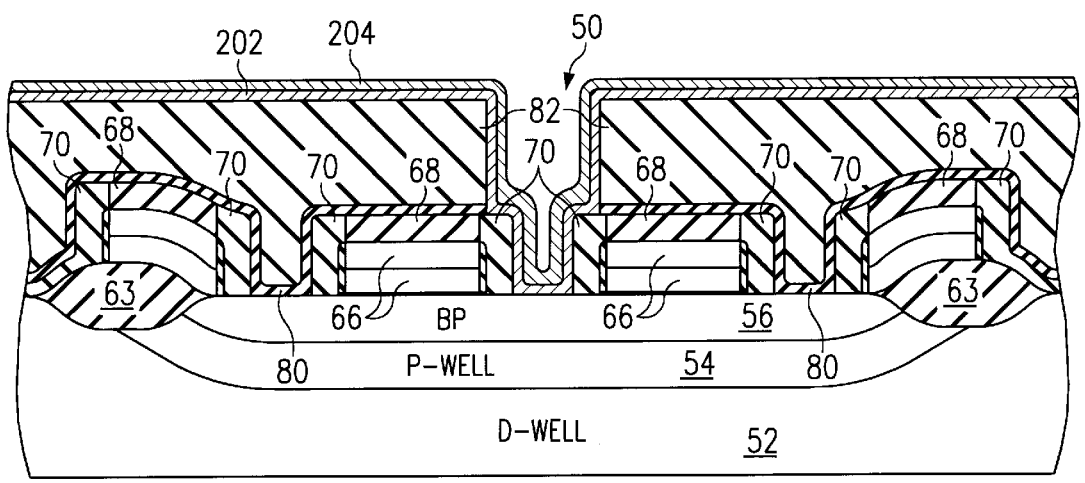
FIG. 2F shows the cross-section of the device of FIG. 2E following the deposit of two layers of conductive materials.

Thereafter, as shown in FIG. 2F, a 700A layer of polysilicon 202 is laid down on the oxide and down into the bitline contact hole making an electrical connection with the substrate top surface. Then a 800A layer of tungsten silicide 204 is deposited over the entire top surface of the layer of polysilicon 202. This layer of tungsten silicide also fills a part of the bitline contact hole.

Figure 2G:
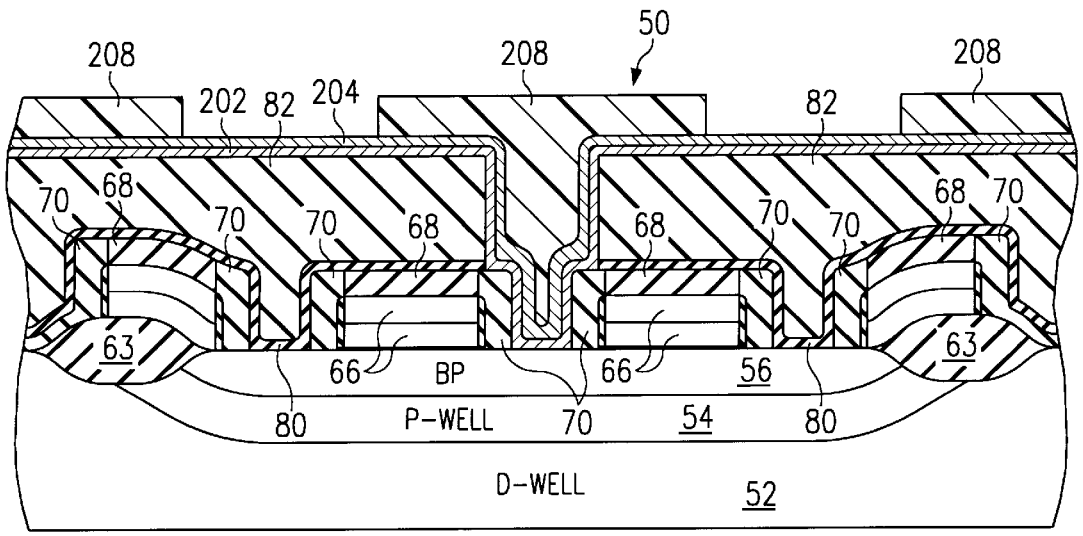
FIG. 2G is the cross-section of the part of FIG. 2F after deposition of a layer of photoresist that is formed into a bitline mask.

As shown in FIG. 2G, a layer of photoresist material 208 is deposited on top of the tungsten silicide 204 and is formed into a mask for opening storage node contact holes.

Figure 2H:
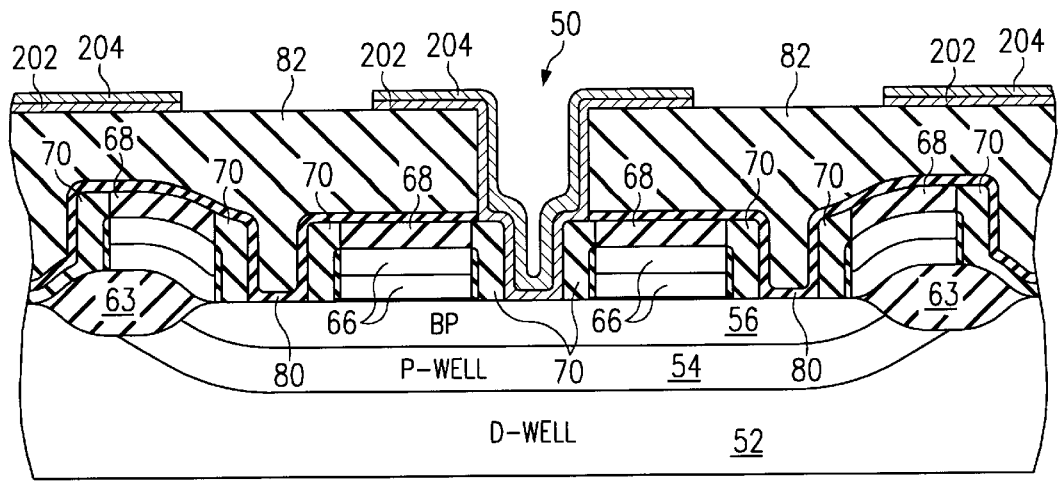
FIG. 2H shows the cross-section of the part of FIG. 2G following an etch of the layers of conductive material and removal of the photoresist mask.

Thereafter, as shown in FIG. 2H, the exposed parts of the layer of polysilicon 202 and the layer of tungsten silicide 204 are etched away where storage node contacts are to be formed. When the etching step is completed, the photoresist mask material 208 is removed.

Figure 2I:
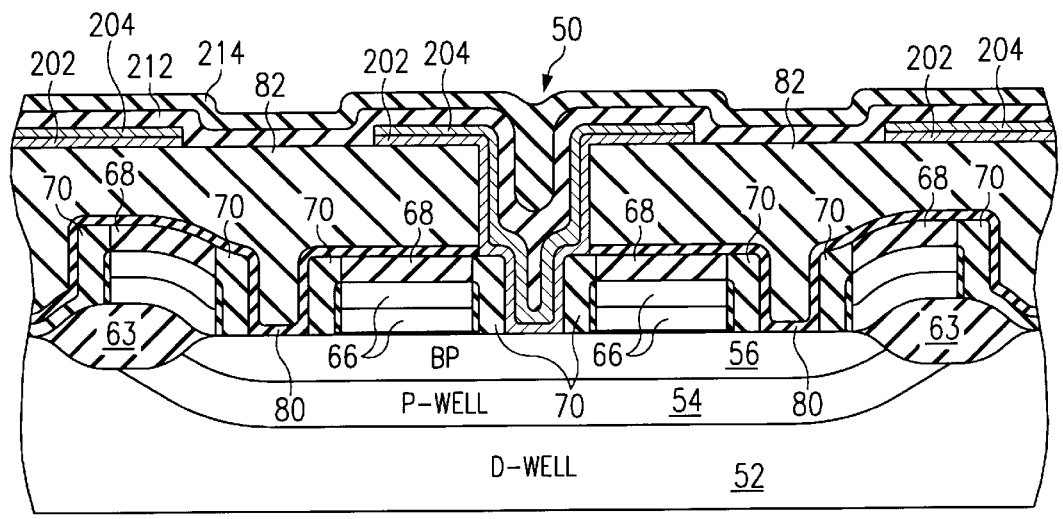
FIG. 2I presents the cross-section of the part of FIG. 2H after two layers of insulating materials are deposited.

FIG. 2I shows the cross-section of the device 50 after two layers of insulating materials are deposited overall. First a 1000A layer of oxide 212, deposited from TEOS, is laid overall. Secondly a 250A layer of silicon nitride 214 is laid over the top of the layer of oxide 212.

Figure 2J:
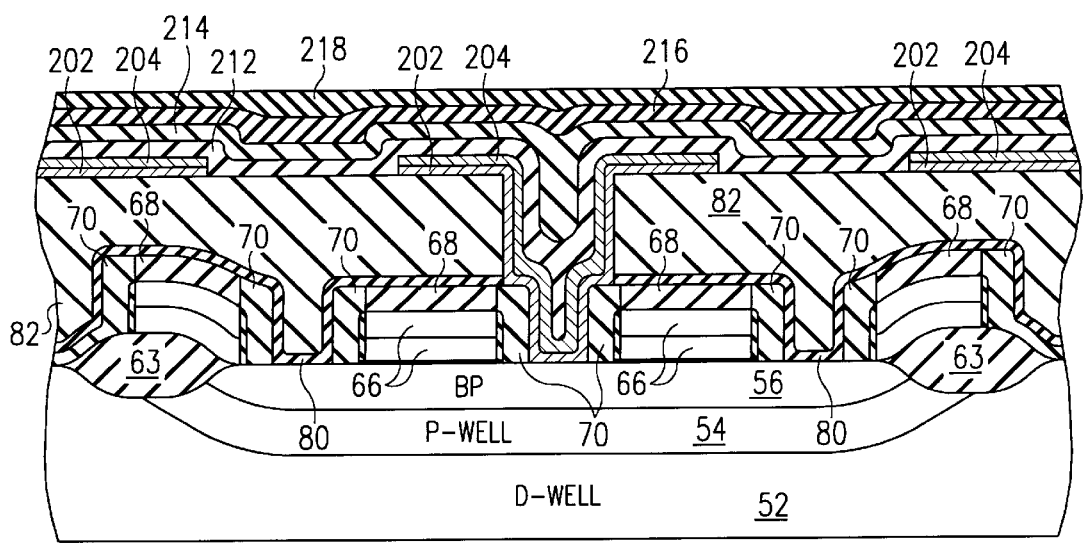
FIG. 2J shows the cross-section of the part of FIG. 2I following deposition of two additional layers of insulating materials.

Thereafter, as shown in FIG. 2J, two additional layers of insulators are deposited overall. The next insulating layer is a 5000A BPSG deposit 216. Another insulating layer 218 is deposited on top of the BPSG deposit. The insulating layer 218 may be an HLD deposit 218 from TEOS.

Figure 2K:
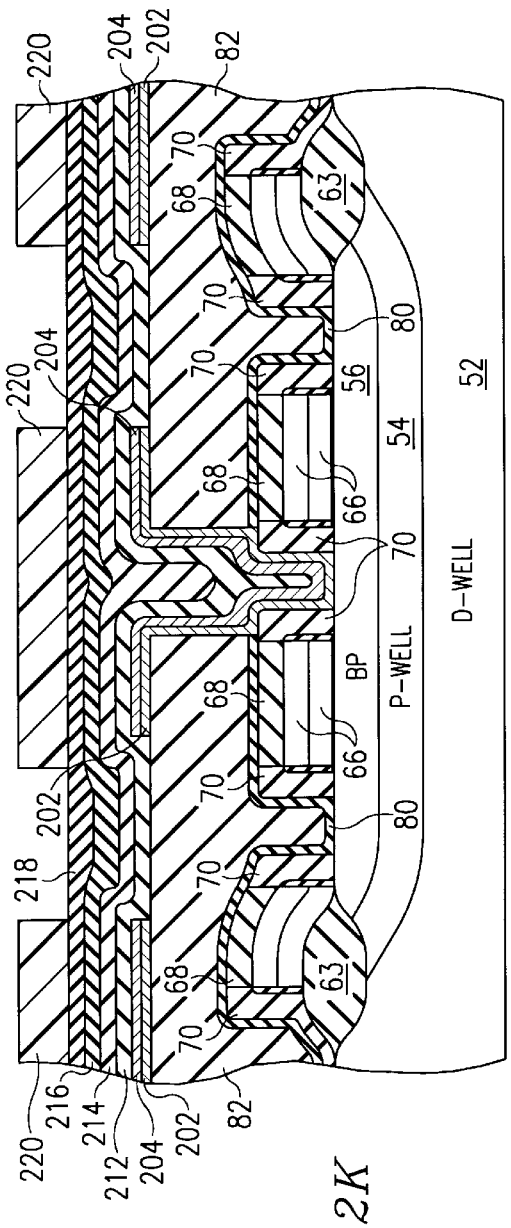
FIG. 2K is the cross-section of the part of FIG. 2J after a layer of photoresist is deposited and formed into a mask for creating storage node contact holes.

In FIG. 2K, there is shown the cross-section of the device 50 with a layer of photoresist 220 formed into a photomask for opening storage node contact holes through the layers of insulators to the top surface of the silicon substrate. A silicon oxide etch is performed in two steps.

For the first step of this oxide etch, the conditions are:

| Pressure | 100 | +/−20% | m torr |
|---|---|---|---|
| Gap | 11 | +/−10% | mm |
| Power | 0 | +/−20% | watts |
| CO | 150 | +/−20% | sccm |
| Ar | 600 | +/−20% | sccm |
| $C_4F_8$ | 2 | +/−20% | sccm |
| $CF_4$ | 5 | +/−20% | sccm |
| Backside pressure | | | |
| (center) | 20 | | torr |
| (edge) | 7.5 | | torr |

The bottom electrode is held at approximately 20mC. As a result of this first step, a substantial part of the oxides are removed from the storage node contact holes.

For the second step of etching through the oxide, the conditions are:

| Pressure | 100 | +/−20% | m torr |
|---|---|---|---|
| Gap | 11 | +/−10% | mm |
| Power | 1500 | +/−20% | watts |
| CO | 150 | +/−20% | sccm |
| Ar | 600 | +/−20% | sccm |
| $C_4F_8$ | 2 | +/−20% | sccm |
| $CF_4$ | 5 | +/−20% | sccm |
| Backside pressure | | | |
| (center) | 20 | | torr |
| (edge) | 7.5 | | torr |

The bottom electrode is held at approximately 20mC. As a result of this second step, the storage node contact holes are etched down to the surface of the substrate. It is noted that argon is an inert gas and that helium or nitrogen can be substituted.

Figure 2L:
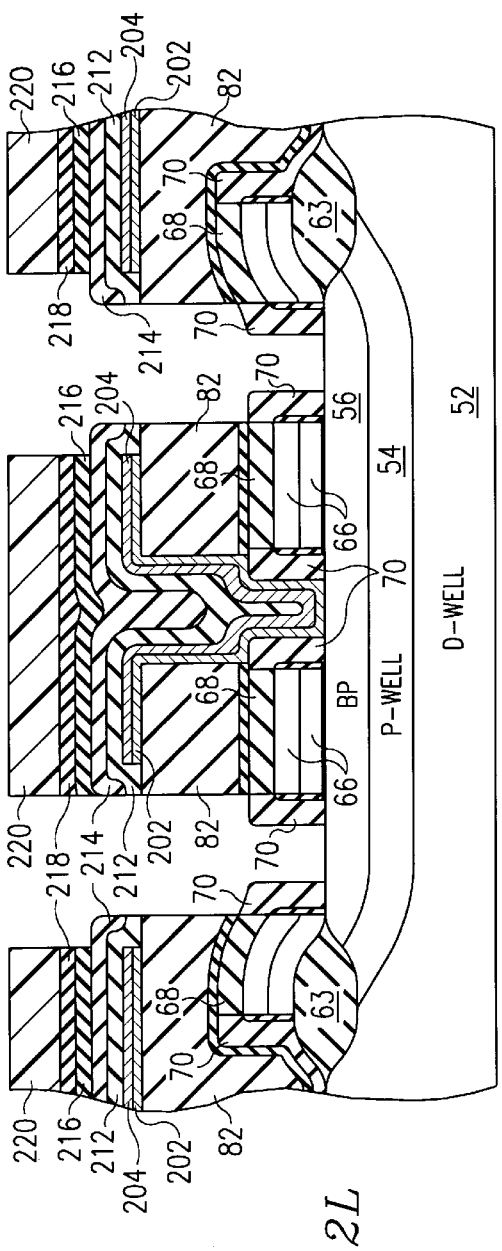
FIG. 2L is the cross-section of the part of FIG. 2K following an oxide etch of storage node contact holes.

Referring now to FIG. 2L, there is shown the cross-section of the integrated circuit device of FIG. 2K after the self-aligned anisotropic etch of storage node contact holes through several layer of oxides to the top surface of the silicon substrate material. This oxide etch for the storage node contacts is accomplished with a single mask step. Subsequently, contact material can be deposited to make direct contact with the semiconductor substrate material. It is noted that the oxide etch leaves the silicon nitride sidewall insulation 70 adjacent the conductive layers 66. The silicon nitride sidewall insulators 70 retain their square shoulders and desired insulation thickness.

Figure 2M:
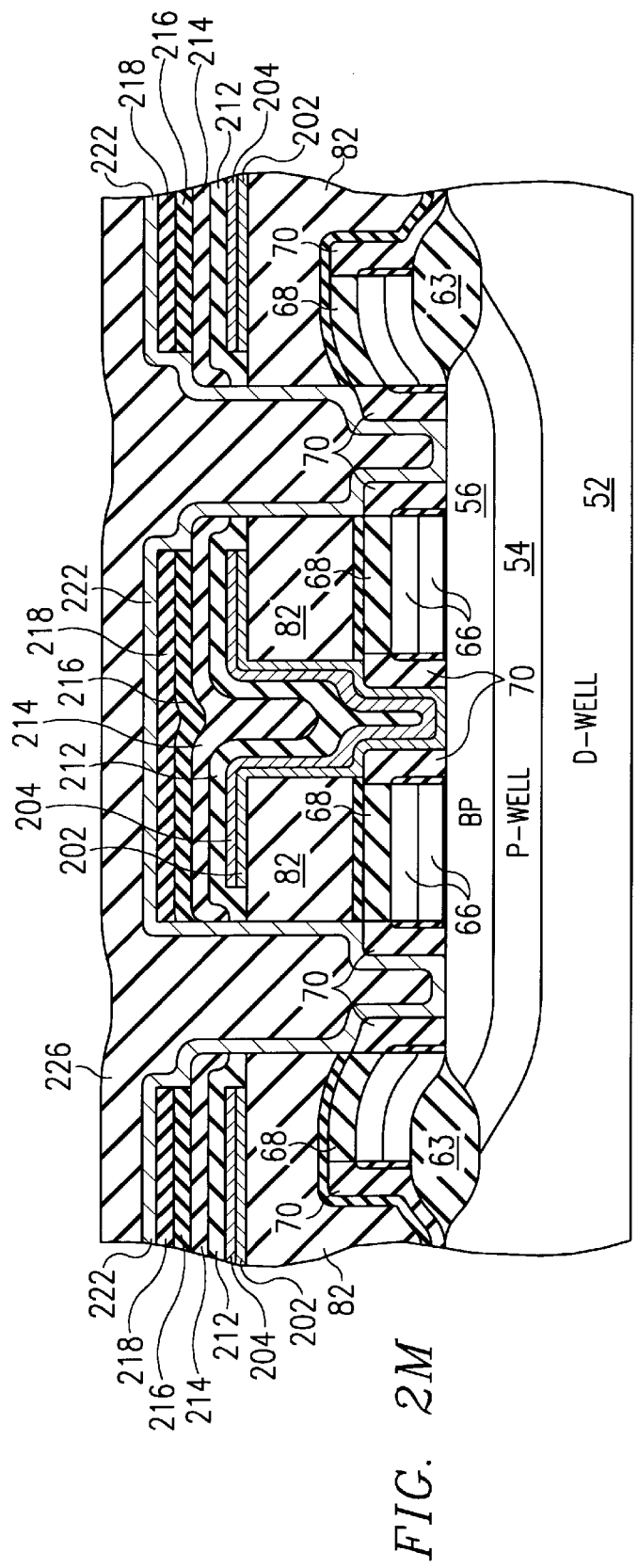
FIG. 2M is the cross-section of the part of FIG. 2L after the photoresist mask is removed, a layer of conductive material is deposited, and silicon dioxide is deposited over the conductor.

FIG. 2M shows the cross-section of the device being fabricated following deposition of a layer of polysilicon 222 over the entire top surface after the self-align etch step shown in FIG. 2L. After the layer of polysilicon 222 is in place, a thick layer of silicon oxide 226 is deposited overall. This deposit of silicon oxide 226 covers the entire top surface of the layer of polysilicon 222 including filling the remainder of the storage node contact holes.

Figure 2N:
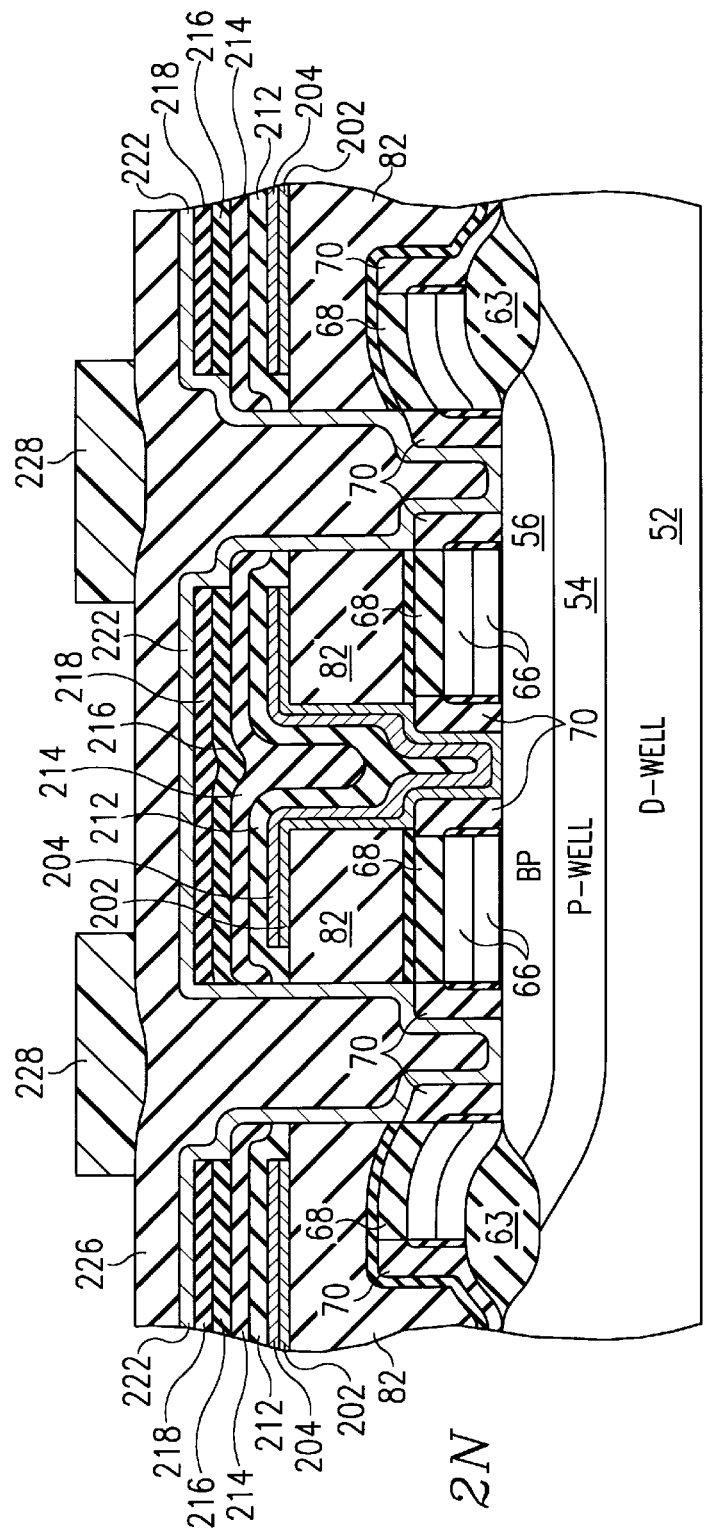
FIG. 2N is the cross-section of the part of FIG. 2M showing photoresist formed into a mask on top of the silicon dioxide.

In FIG. 2N, there is shown a cross-section of the device of FIG. 2M after the depositing of a layer of photoresist material and forming it into a pattern for shaping a conductor into part of a storage plate for a storage cell capacitor.

FIG. 2O, shows the cross-section of the device of FIG. 2N following an anisotropic etch of the silicon oxide layer 226 and removal of the photoresist mask 228 of FIG. N.

Figure 2P:
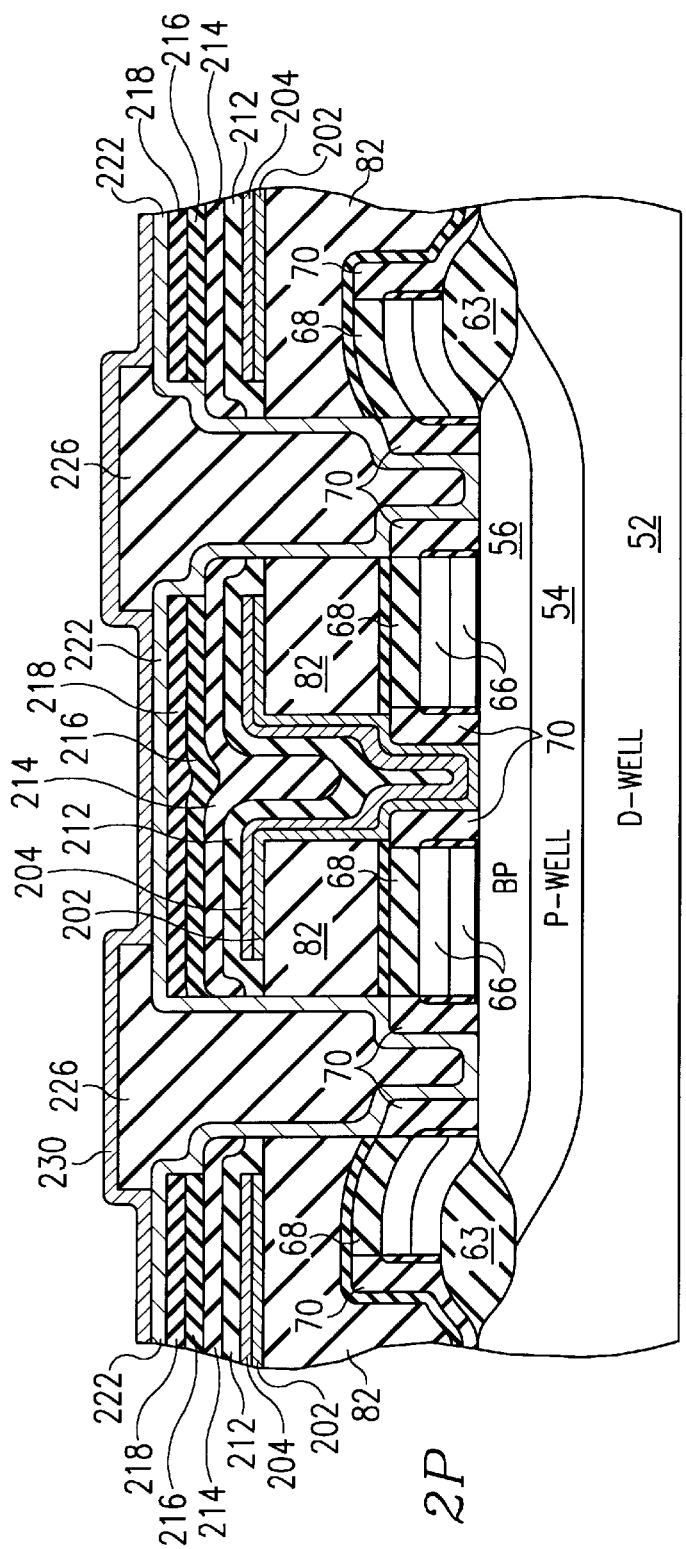
FIG. 2P is a cross-section of the part of FIG. 2O after a layer of conductive material is deposited overall.

Referring now to FIG. 2P, a layer of polysilicon 230 is deposited over all of the top of the device of FIG. 2O. It is noted that the polysilicon 230 covers the top of the silicon oxide mesas 226 and the sidewalls of those mesas. The polysilicon 230 is in contact with the layer of polysilicon 222 which forms the storage node contact.

Figure 2Q:
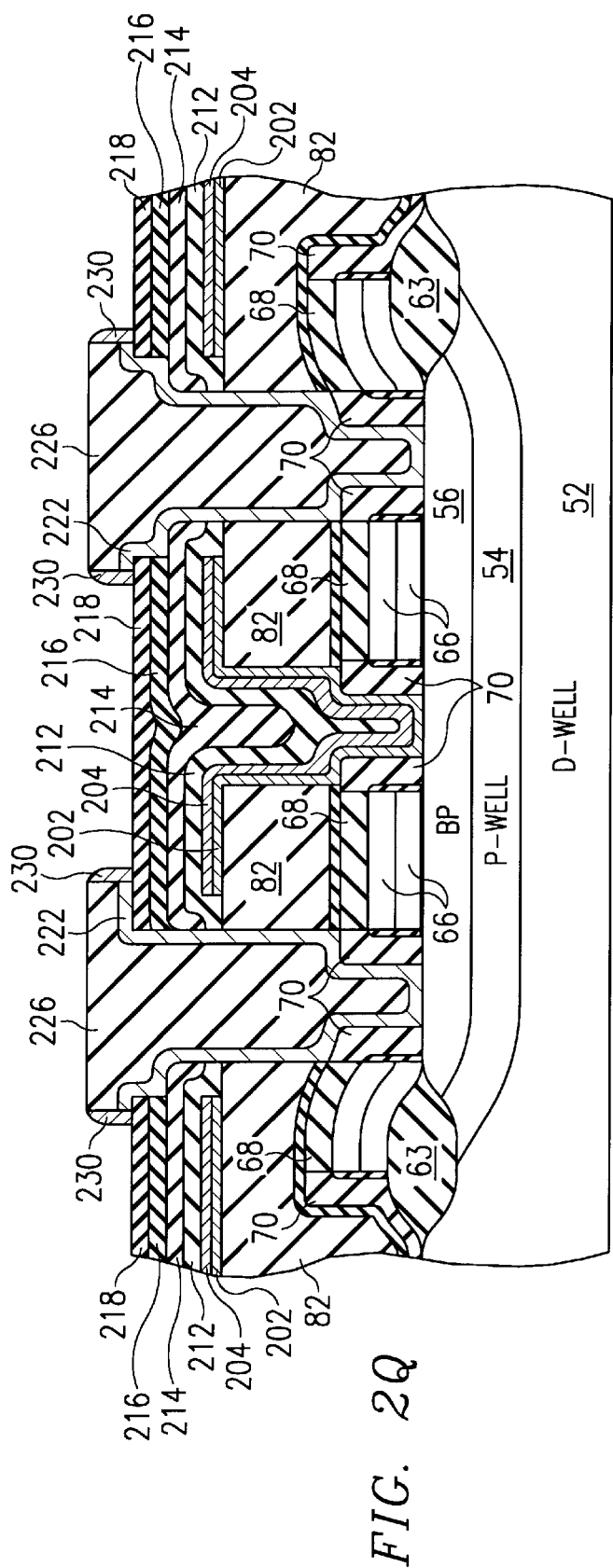
FIG. 2Q shows a cross-section of the part of FIG. 2P following an anisotropic etch of the layer of conductive material.

In FIG. 2Q, the device of FIG. P is shown subsequent to an anisotropic etch of the polysilicon layer 230 of FIG. 2P. In FIG. 2Q, the polysilicon 230 located on the sidewalls of the mesas 226 remains in place while the horizontal portions of the polysilicon 230 have been etched away. It is noted that the sidewall polysilicon 230 continues to be directly in contact with the layer of polysilicon 222 forming the storage node contact. The sidewall polysilicon 230 forms a main portion of the storage plate of the storage cell capacitor being fabricated.

Figure 2R:
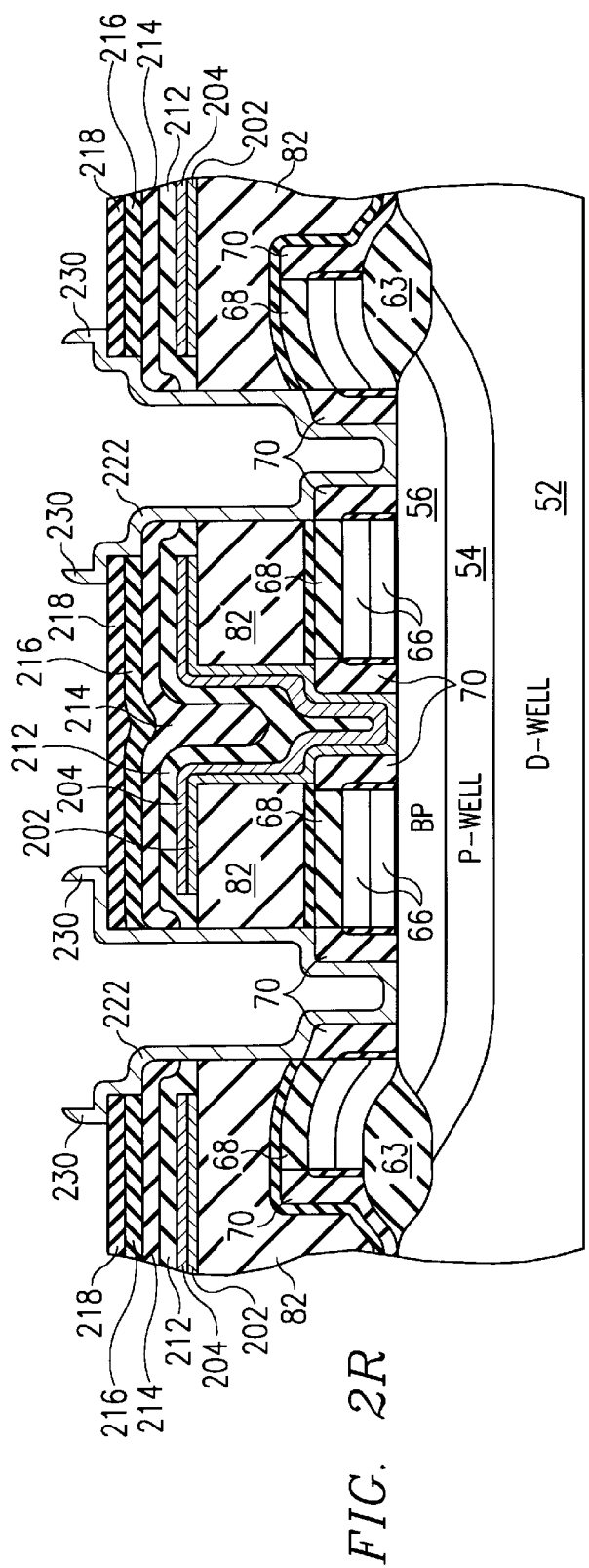
FIG. 2R is the cross-section of the part of FIG. 2Q after an oxide dry etch clears out the torch shaped storage node contact regions.

Referring now to FIG. 2R, there is shown the cross-section of the semiconductor device of FIG. 2Q after the oxide 226 is etched away. Remaining parts of the conductive polysilicon layers 230 and 222 are shaped to form a storage node plate having a torch like cross-section.

Figure 2S:
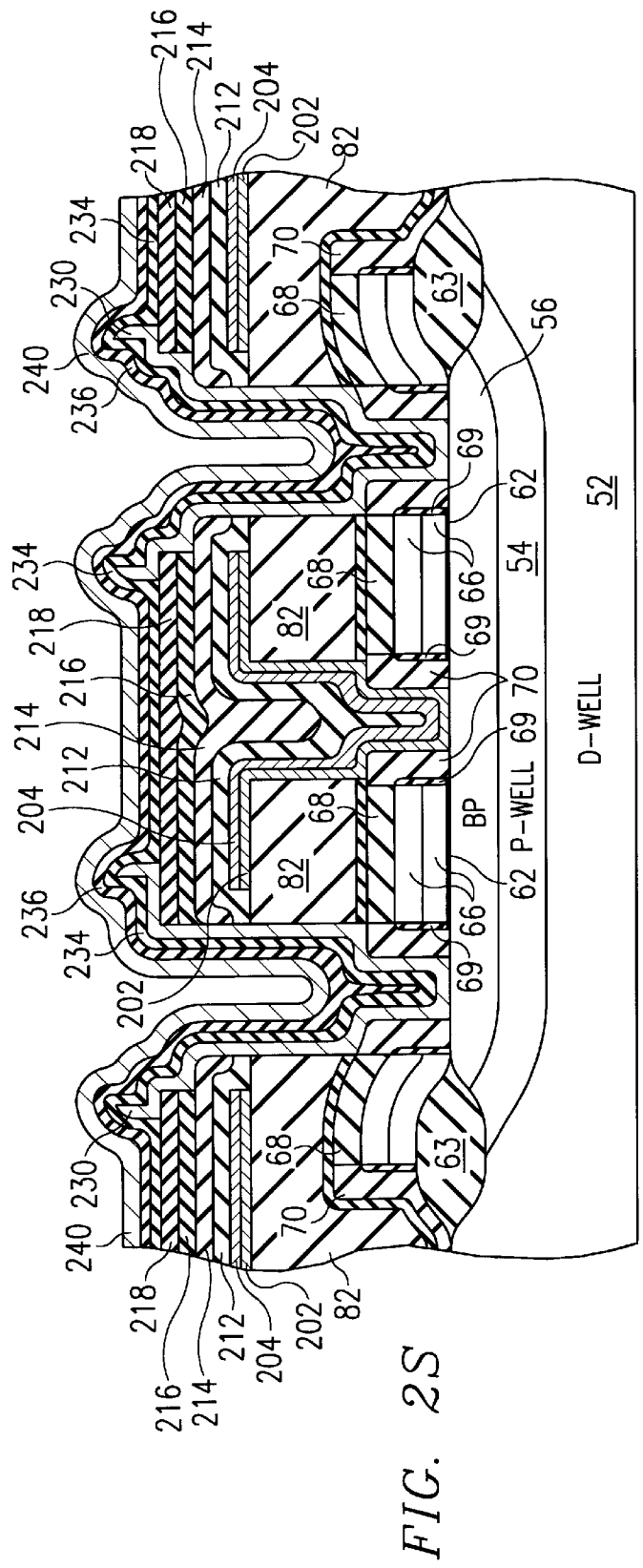
FIG. 2S is a cross-section of part of FIG. 2R following the deposition of layers of insulating materials and the deposition of a layer of conductive material as a field plate.

FIG. 2S, shows the cross-section of the semiconductor device of FIG. R following deposition of an oxide insulation layer 234, a tungsten silicide insulation layer 236, and a polysilicon conductive layer 240. The polysilicon layer 240 forms a field plate for the cell storage capacitors for the array of the semiconductor device 50.

Figure 3:
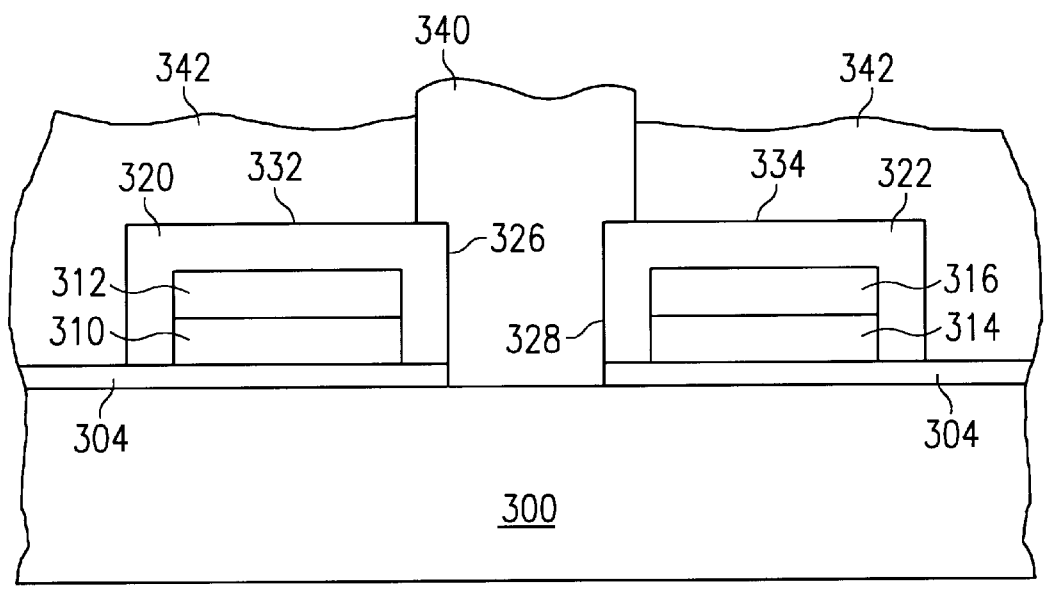
FIG. 3 is an exemplary cross-section of a device having conductive layers adequately insulated from a conductive contact region.

Referring now to FIG. 3, there is shown a cross-section of the advantageous structure formed by the two previously described integrated circuit fabrication processes. A semiconductor substrate 300 has a thin layer of insulative material 300, such as silicon oxide, covering most of the top surface of the substrate 300. Conductive materials 310, 312, 314, 316, are built up over the layer of insulative material 304. The conductive materials 310 and 314 may be polysilicon. Conductive materials 312 and 316 may be a different and more conductive material such as tungsten silicide. When these conductive materials are patterned and formed, they typically are left with relatively sharp, near right angle, corners where their sidewalls meet the top surfaces.

A coating of silicon nitride 320, 322 covers each of the two separate regions of conductive materials 310, 312, 314, and 316. It is noted that the sidewalls 326 and 328 of silicon nitride 320 and 322 are substantially vertical after a hole for a conductive contact has been etched between those two sidewalls 326 and 328. The top surfaces 332 and 334 of the silicon nitride 320 and 322 are substantially flat, surfaces. Thus the intersections of the sidewalls 326 and 328, respectively, with the top surfaces 332 and 334 of the silicon nitride form relatively square shoulders.

These square shoulders ensure that sufficient insulative silicon nitride 320 and 322 remains between the conductive regions 310, 312 and 314, 316 and the conductive contact material 340 which subsequently is used to fill the etched out contact hole.

Dimensions of the contact can be made very small in this structure. For example, the top of the contact material may be as narrow as approximately 0.3 MM. The bottom of the contact material where it makes contact with the surface of the semiconductor substrate 200 may be as narrow as approximately 0.2 MM.

Figure 4:
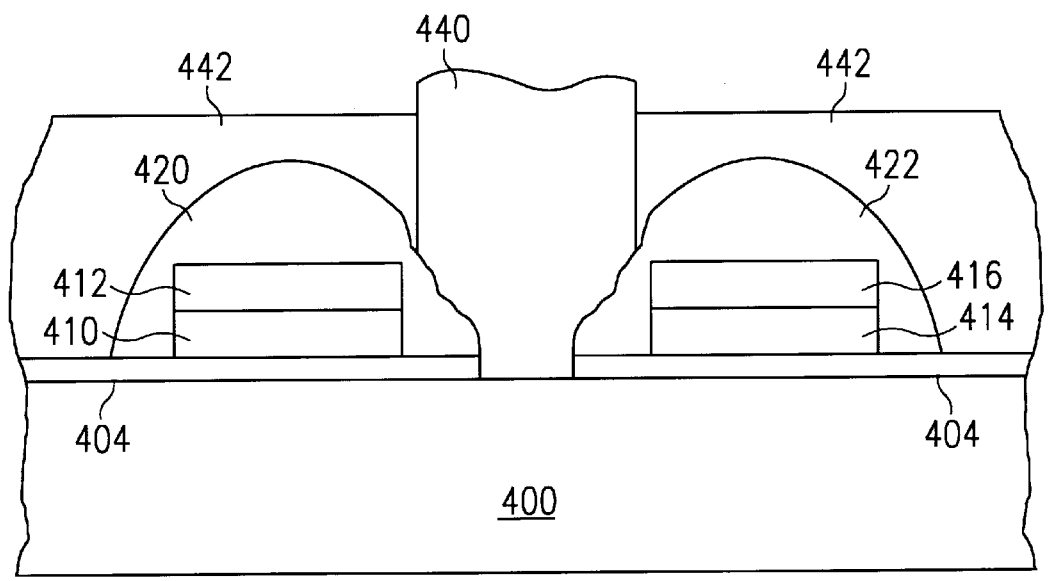
FIG. 4 is a cross-section of a prior art device having conductive layers inadequately insulated from a conductive contact region.

FIG. 4 shows a cross-section of an integrated circuit device fabricated in accordance with a prior art processing sequence. A semiconductor substrate 400 has a thin layer of silicon nitride 404 laid on the surface of the substrate 400. Conductive materials 410, 412, 414, 416 are built up over the insulative material 404. The conductive materials have relatively square shoulders formed by their sidewalls and top surfaces.

A coating of silicon nitride 420, 422 covers each of the separate regions of conductive materials. Because of the geometry of the silicon nitride before etching contact holes and because the etching process does not have the right combination of etching chemistry and process conditions which can produce the true anisotropic etch, the shoulder formed by the sidewalls and the top of the silicon nitride are severely rounded. The rounding and etching a way of the silicon nitride 420 and 422 is so sever that little material is left to insulate the conductive material 412, 416 from contact 440. The selectivity of the subsequent oxide etch is reduced because of the rounded shoulder. There is insufficient insulation to prevent a short circuit after the oxide etch and deposit of the conductive contact material. A significant advantage of this new sidewall etch process that makes the one mask step storage node contact etch possible.

The foregoing describes new structures produced using the described new methods. Those new structures, together with others made obvious in view thereof, are considered to be within the scope of the appended claims.

What is claimed is:

1. An integrated circuit comprising:
    a substrate;
    a first insulative layer deposited on a surface of the substrate;
    a conductor laid upon the first insulative layer, the conductor having a sidewall; and
    a layer of silicon nitride covering a top surface and the sidewall of the conductor, the silicon nitride having a relatively square shoulder where the silicon nitride covering the top surface of the conductor meets the silicon nitride covering the sidewall of the conductor.

2. The integrated circuit of claim 1 wherein the conductor comprises a multilayer conductor.

3. The integrated circuit of claim 1 wherein the conductor comprises the gate of a transistor.

4. The integrated circuit of claim 3 wherein the conductor comprises the gate of a transistor which is part of a memory cell.

5. The integrated circuit of claim 4 wherein the conductor comprises the gate of a transistor which is part of a dynamic random access memory cell.

6. The integrated circuit of claim 5 and further comprising a storage node contact abutting the silicon nitride at the sidewall at one edge of the conductor.

7. The integrated circuit of claim 5 and further comprising a bit line contact abutting the silicon nitride at the sidewall at one edge of the conductor.

8. The integrated circuit of claim 7 and further comprising a storage node contact abutting the silicon nitride at the sidewall at another edge of the conductor.

9. A method for fabricating an integrated circuit device, the method comprising the steps of:
    a) forming a conductive structure with a top layer of silicon nitride and silicon dioxide sidewalls on a semiconductor substrate;
    b) depositing an insulating layer of silicon nitride over the entire substrate and the sidewalls and top of the conductive structure; and
    c) etching the layer of silicon nitride to form an opening through the silicon nitride to a surface of the semiconductor substrate without substantially rounding off shoulders of the silicon nitride covering the sidewalls of the conductive structure.

10. The method of claim 9 wherein the etching step uses a silicon nitride dry-etch comprising $Cl_2+SF_6+CHF_3+He$.

11. The method of claim 10 wherein the etching step forms a polymer on the top surface of the silicon nitride and thereby reduces the rate of etching at the shoulders of the silicon nitride covering the sidewalls of the conductive structure.

12. The method of claim 11 wherein the silicon nitride etching step uses a main dry etch comprising:

pressure at 255+/−20% m torr;

a gap of 1.3 +/−10% cm;

power at 205 +/−20% watts;

$Cl_2$ at 25+/−20% sccm;

$SF_6$ at 155+/−20% sccm;

He at 64+/−20% sccm; and $CHF_3$ at 11+/−20% sccm.

13. The method of claim 12 wherein the silicon nitride etching step uses an overetch comprising:

pressure at 200+/−20% m torr;

a gap of 1.5+/−10%cm;

power at 130+/−20% watts;

He at 130+/−20% sccm; and $CHF_3$ at 45+/−20% sccm.

14. The method of claim 9 further comprising the steps of:

d) depositing a layer of silicon dioxide over exposed surfaces of the silicon nitride and the semiconductor substrate;

e) depositing boron phosphor silicon glass overall to produce a level surface:

f) forming a mask for a contact;

g) etching through the boron phosphor silicon glass and the layer of silicon dioxide to the surface of the semiconductor substrate; and h) depositing a conductor overall to connect with the surface of the semiconductor substrate.

15. The method of claim 9 wherein the etching step uses a silicon nitride dry-etch comprising $Cl_2+SF_6+CHF_3+Ar$.

* * * * *